US012641793B2

(12) United States Patent
Kim et al.

(10) Patent No.: US 12,641,793 B2
(45) Date of Patent: May 26, 2026

(54) NONVOLATILE MEMORY DEVICE

(71) Applicant: SAMSUNG ELECTRONICS CO., LTD., Suwon-si (KR)

(72) Inventors: Minho Kim, Seongnam-si (KR); Hyunmook Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 702 days.

(21) Appl. No.: 17/898,682

(22) Filed: Aug. 30, 2022

(65) Prior Publication Data

US 2023/0171964 A1     Jun. 1, 2023

(30) Foreign Application Priority Data

Nov. 30, 2021     (KR) ........................ 10-2021-0167872
Feb. 3, 2022     (KR) ........................ 10-2022-0014358

(51) Int. Cl.
H10B 43/40          (2023.01)
G11C 16/04          (2006.01)
(Continued)

(52) U.S. Cl.
CPC ......... H10B 43/40 (2023.02); G11C 16/0483 (2013.01); G11C 16/08 (2013.01);
(Continued)

(58) Field of Classification Search
CPC ........ H10B 20/00; H10B 41/35; H10B 41/41; H10B 43/35; H10B 80/00; H10B 43/40;
(Continued)

(56) References Cited

U.S. PATENT DOCUMENTS 7,679,133 B2     3/2010 Son et al.
8,553,466 B2     10/2013 Han et al.
(Continued)

OTHER PUBLICATIONS

T. Song, "Many-Tier Vertical GAAFET (V-FET) for Ultra-Miniaturized Standard Cell Designs Beyond 5 nm," in IEEE Access, vol. 8, pp. 149984-149998, 2020, doi: 10.1109/ACCESS.2020.3015596.) (Year: 2020).*

(Continued)

*Primary Examiner* — Julio J Maldonado
*Assistant Examiner* — Paul A Berry
(74) *Attorney, Agent, or Firm* — Sughrue Mion, PLLC

(57)          ABSTRACT

A nonvolatile memory device including a first semiconductor structure including a first semiconductor substrate, a memory cell area including a plurality of memory cells disposed on the first semiconductor substrate, and a first metal pad disposed on the memory cell area; a second semiconductor structure including a second semiconductor substrate, a page buffer disposed on the second semiconductor substrate, and a second metal pad bonded to the first metal pad; and a third semiconductor structure including a third semiconductor substrate, a buffer memory and peripheral circuits disposed on the third semiconductor substrate, and a third metal pad connected to the peripheral circuits, wherein the page buffer includes a plurality of vertical transistors including a source area, a channel area, and a drain area sequentially stacked in a first direction, and the first semiconductor structure to third semiconductor structure are connected in the first direction.

15 Claims, 22 Drawing Sheets

(51) Int. Cl.

| | |
|---|---|
| *G11C 16/08* | (2006.01) |
| *H10B 41/35* | (2023.01) |
| *H10B 41/41* | (2023.01) |
| *H10B 43/35* | (2023.01) |
| *H10W 20/41* | (2026.01) |

(52) U.S. Cl.
CPC ............. *H10B 41/35* (2023.02); *H10B 41/41* (2023.02); *H10B 43/35* (2023.02); *H10W 20/435* (2026.01)

(58) Field of Classification Search
CPC ........ H10B 43/50; H10B 41/50; H10B 43/27; H10B 41/27; H01L 23/5283; H01L 2225/06544; H01L 23/481; H01L 2224/80895; H01L 2224/80896; H10D 30/501; H10D 62/119; H10D 62/121; H10D 62/123; G11C 16/0483; G11C 16/08; G11C 16/24; G11C 16/26
See application file for complete search history.

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 9,941,009 B2 * | 4/2018 | Lim | G11C 5/025 |
| 10,141,326 B1 * | 11/2018 | Oh | H10B 43/40 |
| 10,546,875 B2 | 1/2020 | Kim et al. | |
| 10,937,766 B2 | 3/2021 | Liu | |
| 11,011,208 B2 | 5/2021 | Lim et al. | |
| 11,031,377 B2 | 6/2021 | Liu | |
| 11,056,454 B2 | 7/2021 | Liu | |
| 2011/0233648 A1 | 9/2011 | Seol et al. | |
| 2015/0162341 A1 | 6/2015 | Aritome | |
| 2020/0328176 A1 * | 10/2020 | Liu | G11C 11/005 |
| 2020/0328186 A1 * | 10/2020 | Liu | H01L 24/08 |
| 2020/0350286 A1 | 11/2020 | Cheng et al. | |
| 2021/0210460 A1 | 7/2021 | He | |

OTHER PUBLICATIONS

Song, "Many-Tier Vertical GAAFET (V-FET) for Ultra-Miniaturized Standard Cell Designs Beyond 5 nm", IEEE Access, Aug. 10, 2020, (5 total pages).

Kotabe et al., "A Low-Power Four-Transistor SRAM Cell With a Stacked Vertical Poly-Silicon PMOS and a Dual-Word-Voltage Scheme", IEEE Journal of Solid-State Circuits, vol. 40, No. 4, Apr. 2005, (7 pages total).

* cited by examiner 400
412
410
411
422a
420
421
432
433
434
430
431
435
422b
423
10

CELL
BL

NONVOLATILE MEMORY DEVICE

CROSS-REFERENCE TO RELATED APPLICATION(S)

This application is based on and claims the priority under 35 USC 119 (a) of Korean Patent Application No. 10-2022-0014358 filed on Feb. 3, 2022, and Korean Patent Application No. 10-2021-0167872 filed on Nov. 30, 2021, in the Korean Intellectual Property Office, the disclosure of which is incorporated herein by reference for in its entirety.

BACKGROUND

1. Field

The disclosure relates to a nonvolatile memory device, and more particularly to nonvolatile memory device having vertically-stacked transistors.

2. Description of Related Art

Nonvolatile memory devices may require high speed with a high level of integration to process more data within a shorter time. In order to improve the integration and increase the storage capacity of a nonvolatile memory device, the number of channel structures included in each of the plurality of memory blocks included in the nonvolatile memory device may be increased. However, as the number of channel structures including memory cells increases, the number of page buffers for sensing values stored in the memory cells may also increase. When the number of page buffers increases, a size of a peripheral circuit area of the nonvolatile memory device may become larger.

SUMMARY

Provided are a nonvolatile memory device capable of increasing the number of memory cells that may simultaneously read and write data in a page buffer in parallel by reducing the number of memory cell strings connected to each page buffer and reducing a read operation and write operation time of a plurality of memory cells.

Additional aspects will be set forth in part in the description which follows and, in part, will be apparent from the description, or may be learned by practice of the presented embodiments.

In accordance with an aspect of the disclosure, a nonvolatile memory device includes a first semiconductor structure including a first semiconductor substrate, a memory cell area including a plurality of memory cells disposed on the first semiconductor substrate, and a first metal pad disposed on the memory cell area, the plurality of memory cells including gate electrodes stacked apart from each other and channel structures which penetrate through the gate electrodes and are connected to the first semiconductor substrate; a second semiconductor structure including a second semiconductor substrate, a page buffer disposed on the second semiconductor substrate, and a second metal pad bonded to the first metal pad; and a third semiconductor structure including a third semiconductor substrate, a buffer memory and peripheral circuits disposed on the third semiconductor substrate, and a third metal pad connected to the peripheral circuits by a first connection structure which penetrates through the third semiconductor substrate, wherein the second semiconductor structure is connected to the third semiconductor structure by a second connection structure which penetrates through the second semiconductor substrate, and the page buffer includes a plurality of vertical transistors, and wherein each vertical transistor of the plurality of vertical transistors includes a source area, a channel area, and a drain area sequentially stacked in a first direction, and wherein the first semiconductor structure, the second semiconductor structure, and the third semiconductor structure are connected in the first direction.

In accordance with an aspect of the disclosure, a nonvolatile memory device includes a first semiconductor structure including a first semiconductor substrate, a memory cell area including a plurality of memory cells disposed on the first semiconductor substrate, and a first metal pad disposed on the memory cell area, the plurality of memory cells including gate electrodes stacked apart from each other and channel structures which penetrate through the gate electrodes and are connected to the first semiconductor substrate; a second semiconductor structure including a second semiconductor substrate, a page buffer disposed on the second semiconductor substrate, and a second metal pad bonded to the first metal pad; and a third semiconductor structure including a third semiconductor substrate, a buffer memory disposed on the third semiconductor substrate, peripheral circuits disposed on the buffer memory, and a third metal pad connected to the peripheral circuits by a first connection structure which penetrates through the third semiconductor substrate, and which is connected to the second semiconductor structure by a second connection structure which penetrates through the second semiconductor substrate, wherein the peripheral circuits include a row decoder connected to the page buffer, and other peripheral circuits configured to control the plurality of memory cells, wherein the third semiconductor structure includes a plurality of vertical transistors, wherein each vertical transistor of the plurality of vertical transistors includes a source area, a channel area, and a drain area sequentially stacked in a first direction, and wherein the first semiconductor structure, the second semiconductor structure, and the third semiconductor structure are connected in the first direction.

A nonvolatile memory device includes a first semiconductor structure including a first semiconductor substrate, a memory cell area including a plurality of memory cells disposed on the first semiconductor substrate, and a first metal pad disposed on the memory cell area, the plurality of memory cells including gate electrodes stacked apart from each other and channel structures which penetrate through the gate electrodes and are connected to the first semiconductor substrate; a second semiconductor structure including a second semiconductor substrate, a page buffer disposed on the second semiconductor substrate, and a second metal pad bonded to the first metal pad; and a third semiconductor structure including a third semiconductor substrate, a buffer memory, a row decoder, and other peripheral circuits disposed on the third semiconductor substrate, and a third metal pad connected to the other peripheral circuits by a connection structure which penetrates through the third semiconductor substrate, wherein the row decoder is disposed in a center of the second semiconductor substrate, and is surrounded by the page buffer, and wherein the plurality of memory cells are connected in order of the page buffer, the row decoder, and the other peripheral circuits.

In accordance with an aspect of the disclosure, a nonvolatile memory device includes a first semiconductor structure including a first semiconductor substrate, wherein a plurality of memory cells are disposed on the first semiconductor substrate; a second semiconductor structure including a second semiconductor substrate, wherein the second semiconductor structure is connected to the first semiconductor structure in a first direction; and a third semiconductor structure including a third semiconductor substrate, wherein the third semiconductor structure is connected to the second semiconductor structure in the first direction, wherein a plurality of peripheral circuits are included in the second semiconductor structure and the third semiconductor structure, wherein the plurality of peripheral circuits includes at least one page buffer disposed on the second semiconductor substrate and at least one buffer memory disposed on the second semiconductor substrate, and wherein at least one peripheral circuit of the plurality of peripheral circuits includes a vertical transistor having a source area, a channel area, and a drain area sequentially stacked in the first direction.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
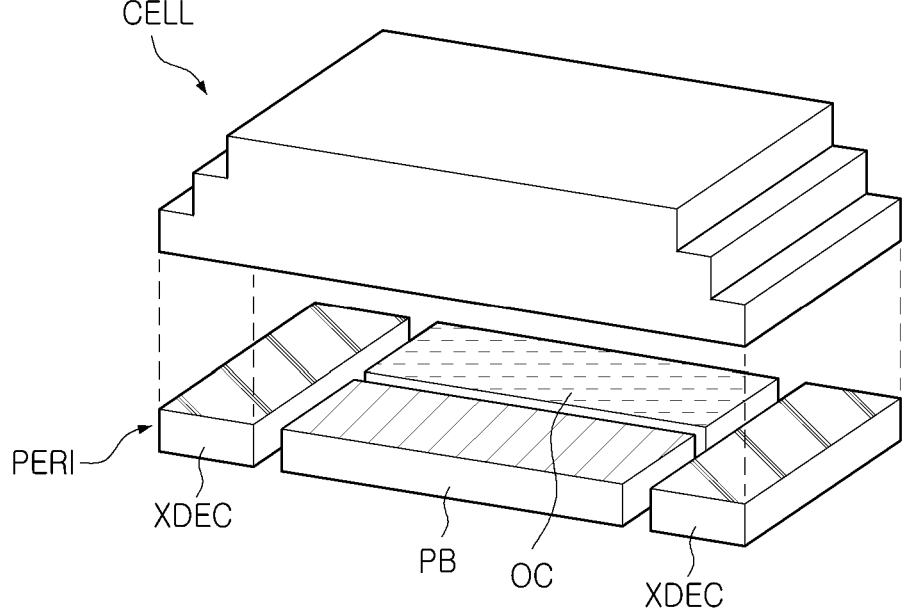
FIG. 1 is a perspective view illustrating a structure of a nonvolatile memory device, according to an embodiment.

Hereinafter, exemplary example embodiments in the present disclosure will be described with reference to the accompanying drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, micropro- cessors, hard-wired circuits, memory elements, wiring con- nections, and the like, which may be formed using semiconductor-based fabrication techniques or other manu- facturing technologies. In the case of the blocks, units and/or modules being implemented by microprocessors or similar, they may be programmed using software (e.g., microcode) to perform various functions discussed herein and may optionally be driven by firmware and/or software. In embodiments, each block, unit and/or module may be imple- mented by dedicated hardware, or as a combination of dedicated hardware to perform some functions and a pro- cessor (e.g., one or more programmed microprocessors and associated circuitry) to perform other functions. Also, each block, unit and/or module of the embodiments may be physically separated into two or more interacting and dis- crete blocks, units and/or modules without departing from the present scope. Further, the blocks, units and/or modules of the embodiments may be physically combined into more complex blocks, units and/or modules without departing from the present scope.

FIG. 1 is a perspective view illustrating a structure of a nonvolatile memory device.

Referring to FIG. 1, a nonvolatile memory device may have a cell on peri (COP) structure. For example, a non- volatile memory device having a COP structure includes a memory cell area CELL including a plurality of memory cells formed in a 3D structure and a peripheral circuit area PERI including peripheral circuits implemented with planar transistors.

The peripheral circuit area PERI may include a page buffer PB, a row decoder XDEC, and other peripheral circuits OC. The row decoders XDEC may be disposed under a stepped structure in which a step is formed to select a word line, and the page buffer PB and other peripheral circuits OC may be disposed between the row decoders XDEC.

Recently, as the number of steps of memory cells included in the nonvolatile memory device increases and the number of bits to be stored per memory cell increases, a storage capacity of the nonvolatile memory device increases. Accordingly, when the existing page buffer PB is used, the time required for a read/write operation may increase, and it may be necessary to increase the size of the page buffer PB to secure an operating performance of the nonvolatile memory device.

In addition, a size of a storage device including a non- volatile memory device tends to become smaller due to integration. Accordingly, it may be necessary to sufficiently secure a space in the peripheral circuit area PERI.

The nonvolatile memory device according to an example embodiment of the present disclosure includes the page buffer PB formed in a separate semiconductor structure and a 3-stack structure in which three semiconductor structures including the same are stacked, so a space in which the page buffer is disposed may be sufficiently secured. In addition, by implementing a latch structure included in the page buffer PB using a vertical transistor, it is possible to use the space of the peripheral circuit area PERI as much as possible and solve the existing space shortage problem.

Figure 2:
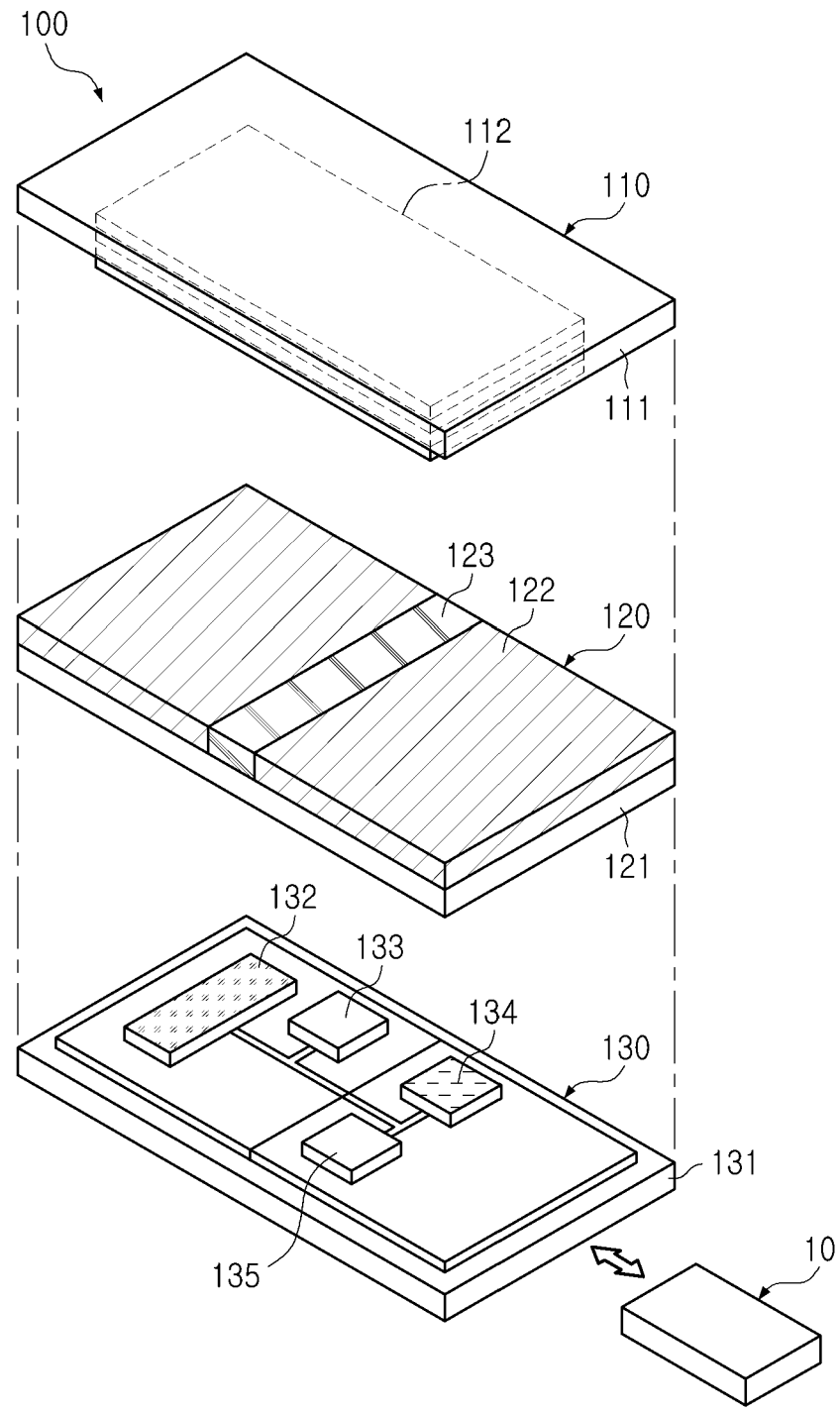
FIGS. 2 and 3 are diagrams illustrating the nonvolatile memory device according to an embodiment.
Figure 3:
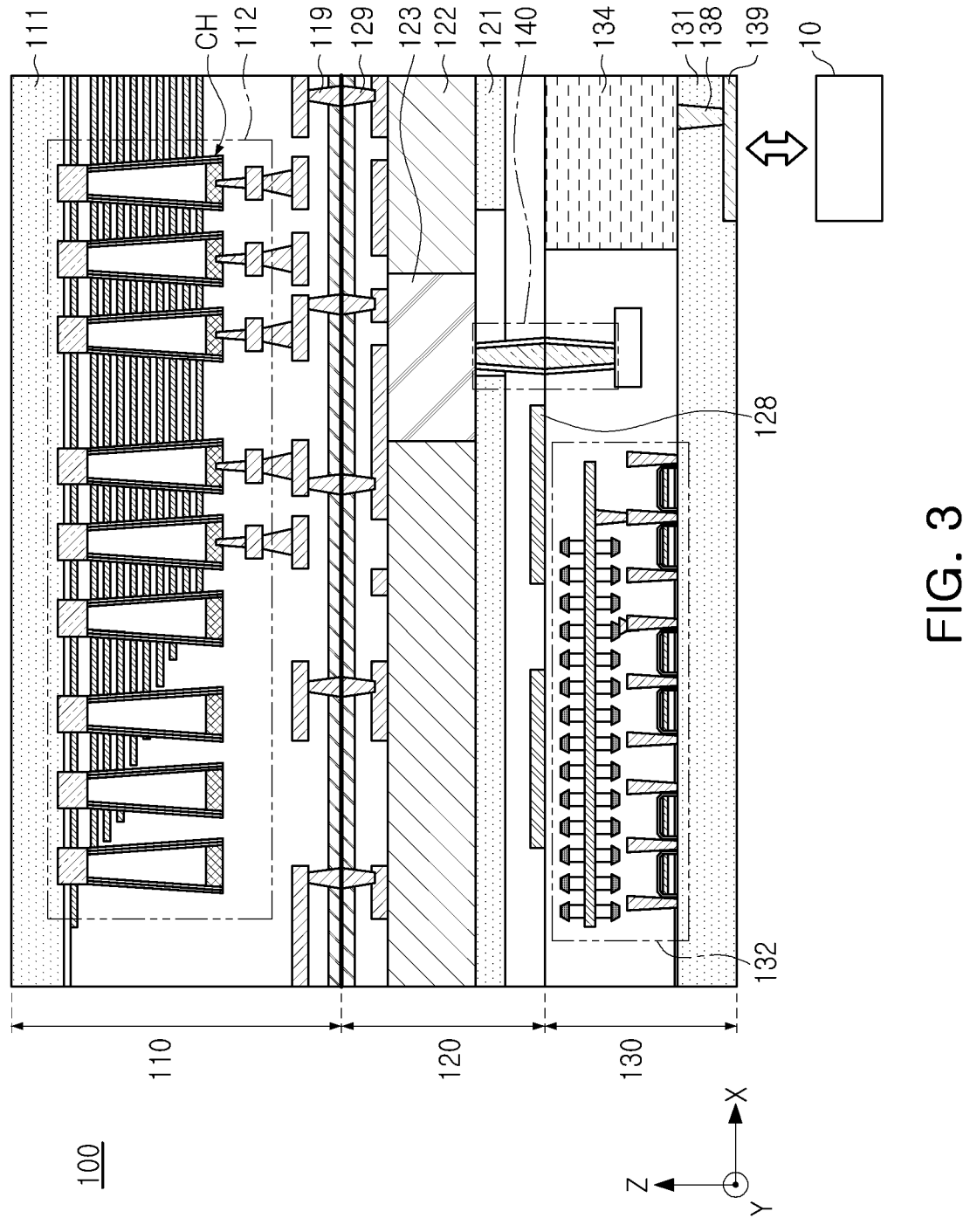

FIGS. 2 and 3 are diagrams illustrating the nonvolatile memory device according to an example embodiment of the present disclosure.

Referring to FIGS. 2 and 3, the nonvolatile memory device according to an example embodiment of the present disclosure may include a first semiconductor structure 110, a second semiconductor structure 120, and a third semicon- ductor structure 130 that have a structure stacked in a first direction (e.g., a Z-direction).

The first semiconductor structure 110 may include a first semiconductor substrate 111 and an upper area of the first semiconductor substrate. The upper area of the first semiconductor substrate may include a memory cell area 112 in which a plurality of memory cells are disposed and a first metal pad 119 disposed above the memory cell area 112.

The first semiconductor substrate 111 may have an upper surface extending in a second direction (e.g., an X-direction) and a third direction (e.g., a Y-direction). The first semiconductor substrate 111 may include a semiconductor material, for example, a group IV semiconductor, a group III-V compound semiconductor, or a group II-VI compound semiconductor. For example, the first semiconductor substrate 111 may include silicon (Si), silicon germanium (SiGe), gallium arsenide (GaAs), germanium (Ge), silicon on insulator (SOI), or other suitable materials. In embodiments, the first semiconductor substrate 111 may be provided as a polycrystalline semiconductor layer such as a polycrystalline silicon layer or an epitaxial layer. The first to third semiconductor substrates 111, 121, and 131 that are included in the first to third semiconductor structures 110, 120, and 130 included in the nonvolatile memory device 100 may include the same material. However, this is only an example and embodiments are not limited thereto.

The plurality of memory cells included in the memory cell area 112 may be implemented with gate electrodes stacked on the first semiconductor substrate 111 spaced apart from each other and channel structures CH that penetrate through the gate electrodes and are connected to the first semiconductor substrate 111. That is, the plurality of memory cells may be memory cells included in a vertical NAND flash memory (VNAND).

The gate electrodes may include electrodes forming a ground selection transistor, a plurality of memory cells, and a string selection transistor sequentially from the first semiconductor substrate 111. The number of gate electrodes included in the plurality of memory cells may be determined according to the capacity of the nonvolatile memory device 100. In this case, the gate electrodes may extend to different lengths to form a stepped structure in the form of a step, and the gate electrodes may be connected to gate contacts through the exposed end portions. In the memory cell area 112, the gate electrodes and gate contacts may be covered with an insulating layer formed of an insulating material.

The gate electrodes may include a metal material, for example, tungsten (W). According to an example embodiment, the gate electrodes may include polycrystalline silicon or a metal silicide material. For example, the gate electrodes may further include a diffusion barrier layer. For example, the diffusion barrier layer may include tungsten nitride (WN), tantalum nitride (TaN), titanium nitride (TiN), or a combination thereof. In embodiments, the interlayer insulating layers disposed between the gate electrodes may include an insulating material such as silicon oxide or silicon nitride.

Each of the channel structures CH constitutes one memory cell string, and may be disposed to be spaced apart from each other while forming rows and columns. The channel structures CH may be disposed to form a grid pattern in an X-Y plane or may be disposed in a zigzag shape in one direction. The channel structures CH may have a columnar shape, and may have inclined side surfaces that become narrower as they get closer to the first semiconductor substrate 111 according to an aspect ratio.

In embodiments, the nonvolatile memory device 100 according to an example embodiment of the present disclosure may be applied to a charge trap flash CFT in which a charge storage layer is formed of an insulating film as well as a flash memory device in which the charge storage layer is formed of a conductive floating gate.

The second semiconductor structure 120 may include a second semiconductor substrate 121 and an upper area of the second semiconductor substrate. The upper area of the second semiconductor substrate may include a page buffer 122, a row decoder 123, and a second metal pad 129 of the nonvolatile memory device 100.

In the nonvolatile memory device 100 according to an example embodiment of the present disclosure, the page buffer 122 is separately disposed in the second semiconductor structure 120, so when the size of the page buffer 122 increases according to the increase in the storage capacity of the nonvolatile memory device 100, a space constraint may be minimized. Accordingly, the nonvolatile memory device 100 may shorten a read operation and a write operation of the plurality of memory cells.

Referring to FIG. 2, the row decoder 123 may be disposed in a center of the second semiconductor substrate 121 to be surrounded by the page buffers 122 in order to load the page buffers 122 disposed on both sides thereof. However, this is only an example and embodiments are not limited thereto.

The second metal pad 129 may be bonded to the first metal pad 119 in the first direction. The first metal pad 119 and the second metal pad 129 may connect the first semiconductor structure 110 and the second semiconductor structure 120 by a wafer bonding method.

The wafer bonding method may form a direct connection path having a short connection length between the first semiconductor structure 110 and the second semiconductor structure 120. Accordingly, the wafer bonding method may improve an input/output speed of data and control signals while eliminating delay due to a chip interface and reducing power consumption.

In embodiments, the first metal pad 119 and the second metal pad 129 may include tungsten (W), cobalt (Co), copper (Cu), aluminum (Al), silicide, or the like. Each of the first metal pad 119 and the second metal pad 129 may be electrically separated by adjacent layers in the second direction (e.g., X-direction) and/or third direction (e.g., Y-direction). As one example, the layer may include silicon oxide, silicon nitride, a low-k dielectric, or the like.

Referring to FIG. 3, the nonvolatile memory device 100 according to an example embodiment of the present disclosure may further include a pad-out layer disposed on a lower surface of the second semiconductor substrate 121. As an example, the pad-out layer may include a dielectric material such as silicon oxide, silicon nitride, and a low-k dielectric.

The pad-out layer may include one or more contact pads 128 for electrically connecting the memory cell area 112 and/or the page buffer 122 with an external circuit. Because the first semiconductor structure 110 and the second semiconductor structure 120 are electrically connected to each other by the wafer bonding method, an electrical signal of an external circuit applied to the contact pad 128 may be transmitted to the memory cell area 112 included in the first semiconductor structure 110. That is, the contact pad 128 may transmit an electrical signal between the nonvolatile memory device 100 and the external circuit for pad-out.

However, this is only an example and embodiments are not limited thereto. For example, the pad-out layer may be disposed on a lower surface of the first semiconductor substrate 111. In this case, an electrical signal of the external circuit, which is applied to the contact pad 128 included in the pad-out layer, may be transmitted to the second semiconductor structure 120 through the first metal pad 119 and the second metal pad 129 connected by the wafer bonding method.

The third semiconductor structure 130 may include a third semiconductor substrate 131 and an upper area of the third semiconductor substrate. The upper area of the third semiconductor substrate may include a buffer memory 132 and other peripheral circuits 134, and the third semiconductor structure 130 may include the third metal pad 139 connected to the peripheral circuits through a connection via 138 penetrating through the third semiconductor substrate 131.

In embodiments, the second semiconductor substrate 121 and the third semiconductor substrate 131 may be electrically connected to each other by a connection structure 140 penetrating through the second semiconductor substrate 121. Referring to FIG. 3, the connection structure 140 may completely penetrate through the second semiconductor substrate 121 and may be connected between a contact extending from a wiring layer of the second semiconductor structure 120 and a wiring layer of the third semiconductor structure 130.

Similar to the wafer bonding method, the connection structure 140 may form a direct connection path having a short connection length between the second semiconductor structure 120 and the third semiconductor structure 130. Accordingly, the connection structure 140 may improve an input/output speed of data and control signals while eliminating delay due to a chip interface and reducing power consumption.

For example, referring to FIG. 2, other peripheral circuits 134 may refer to peripheral circuits other than circuits such as a sense amplifier 133 and a multiplexer 135, for example, a write driver, a charge pump, and the like, but is not limited thereto, and as illustrated in FIG. 3, other peripheral circuits 134 may refer to other peripheral circuits including circuits such as the sense amplifier and the multiplexer. The other peripheral circuits 134 may be implemented with any desired devices (e.g., diodes, resistors, or capacitors) including a plurality of transistors disposed on the third semiconductor substrate 131 and wirings.

The buffer memory 132 may include a plurality of memory cells included in the memory cell area 112 and other memory cells. The buffer memory 132 may adjust a signal and data transfer rate between the nonvolatile memory device and the external device 10 by temporarily storing data stored in the memory cell area 112 or read from the memory cell area 112.

Referring to FIG. 3, in the nonvolatile memory device 100 according to an example embodiment of the present disclosure, the buffer memory 132 may include a dynamic random access memory (DRAM). Accordingly, each of the memory cells included in the buffer memory 132 may be implemented with a selection transistor and a capacitor.

However, this is only an example embodiment and embodiments are not limited thereto, and the buffer memory 132 may include, in addition to the DRAM, a memory device operating on a different principle, such as a static random access memory (SRAM), a magnetoresistive random access memory (MRAM), and a phase-change random access memory (PRAM). Accordingly, elements included in the buffer memory 132 and structures thereof may vary.

The nonvolatile memory device 100 according to an example embodiment of the present disclosure may exchange command CMD, address ADDR, and control CTRL signals with the external device 10 through the third metal pad 139, and may exchange the signals between a plurality of memory cells and peripheral circuits through the connection structure 140. The external device 10 may control the overall operation of the nonvolatile memory device 100 based on the signals exchanged with the nonvolatile memory device 100.

In the nonvolatile memory device 100 according to an example embodiment of the present disclosure, a plurality of memory cells may be connected in the order of the page buffer 122, the row decoder 123, and other peripheral circuits 134. In this case, the page buffers 122 may be disposed on both sides of the row decoder 123. However, this is only an example and embodiments are not limited thereto.

In embodiments, at least some of the circuits included in the nonvolatile memory device 100 may include a plurality of vertical transistors defined by a source area, a channel area, and a drain area sequentially stacked in a first direction (e.g., Z-direction).

For example, the page buffer 122 and/or the row decoder 123 included in the nonvolatile memory device 100 according to an example embodiment of the present disclosure may be implemented with a plurality of vertical transistors. Through this, the nonvolatile memory device 100 according to an example embodiment of the present disclosure may use a space, in which the page buffer 122 is implemented, as much as possible.

Figure 4A:
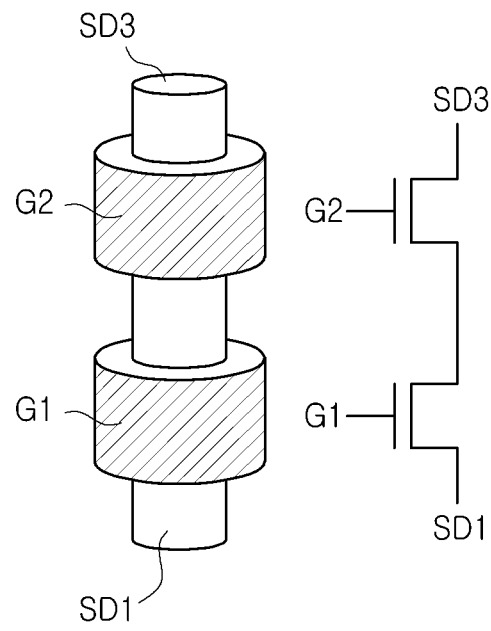
FIGS. 4A and 4B are diagrams for describing a vertical transistor included in the nonvolatile memory device according to an embodiment.
Figure 4B:
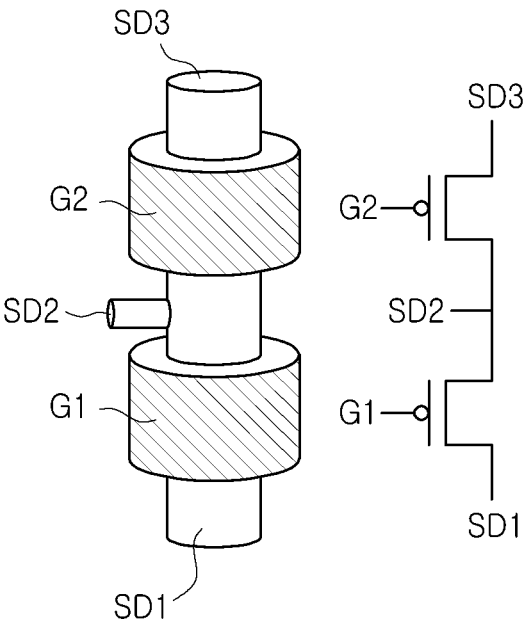
Figure 4C:
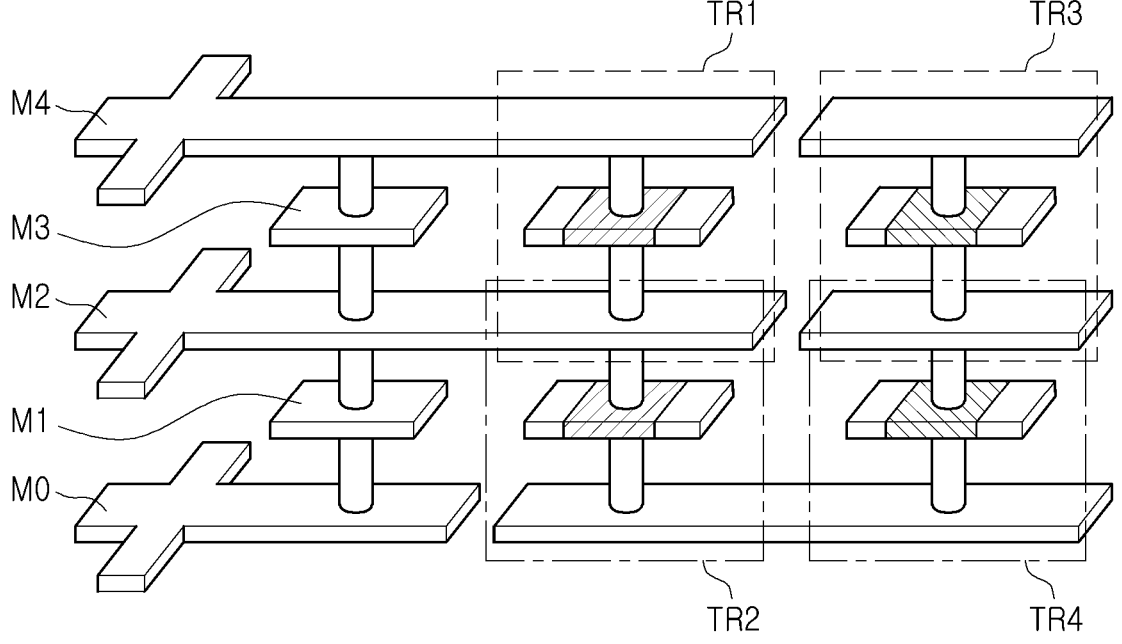
FIG. 4C is a diagram for describing vertical transistors included in a page buffer in the nonvolatile memory device according to an embodiment.

FIGS. 4A and 4B are diagrams for describing a vertical transistor included in the nonvolatile memory device according to an example embodiment of the present disclosure. FIG. 4C is a diagram for describing vertical transistors included in a page buffer in the nonvolatile memory device according to an example embodiment of the present disclosure.

Referring to FIG. 2 together, at least some of the circuits included in the second semiconductor structure 120 of the nonvolatile memory device 100 according to an example embodiment of the present disclosure may be implemented with vertical transistors. For example, the page buffer 122 may include a plurality of page buffers corresponding to a plurality of memory cells, and each of the plurality of page buffers may include a latch structure implemented with four vertical transistors. For example, the plurality of page buffers may correspond to the plurality of memory cells one to one. However, this is only an example and embodiments are not limited thereto.

Referring to FIGS. 4A and 4B, among the vertical transistors, an NMOS transistor may be implemented as illustrated in FIG. 4A, and a PMOS transistor may be implemented as illustrated in FIG. 4B.

The vertical transistor may be implemented by a first source/drain area SD1, a first gate electrode G1, a second gate electrode G2, and a third source/drain area SD3 that are stacked in a vertical direction. In embodiments, referring to FIG. 4B, the vertical transistor may be implemented to have a structure in which a metal structure is connected to the second source/drain area SD2. In the vertical transistor, the channel area surrounded by the first gate electrode G1 and/or the second gate electrode G2 may be formed of a nanowire.

Referring to FIG. 4C, the second semiconductor structure 120 included in the nonvolatile memory device 100 according to an example embodiment of the present disclosure may include wiring structures M0, M1, M2, M3, and M4 that are formed of a plurality of layers having different heights. Circuits included in the semiconductor structures 120 and 130 may be formed by connecting the wiring structures M0, M1, M2, M3, and M4 to other devices.

For example, the latch structure included in the page buffer 122 included in the second semiconductor structure 120 may be implemented with four vertical transistors. The vertical transistors may be disposed two by two in the vertical direction. For example, a first transistor TR1 and a second transistor TR2 may be NMOS transistors illustrated in FIG. 4A, and a third transistor TR3 and a fourth transistor TR4 may be PMOS transistors illustrated in FIG. 4B. However, this is only an example and embodiments are not limited thereto.

In embodiments, because structures such as inverters and buffers may be implemented using the vertical transistors, other peripheral circuits included in the row decoder 123 and the third semiconductor structure 130 in addition to the page buffer 122 are similarly formed of vertical transistors.

Figure 5:
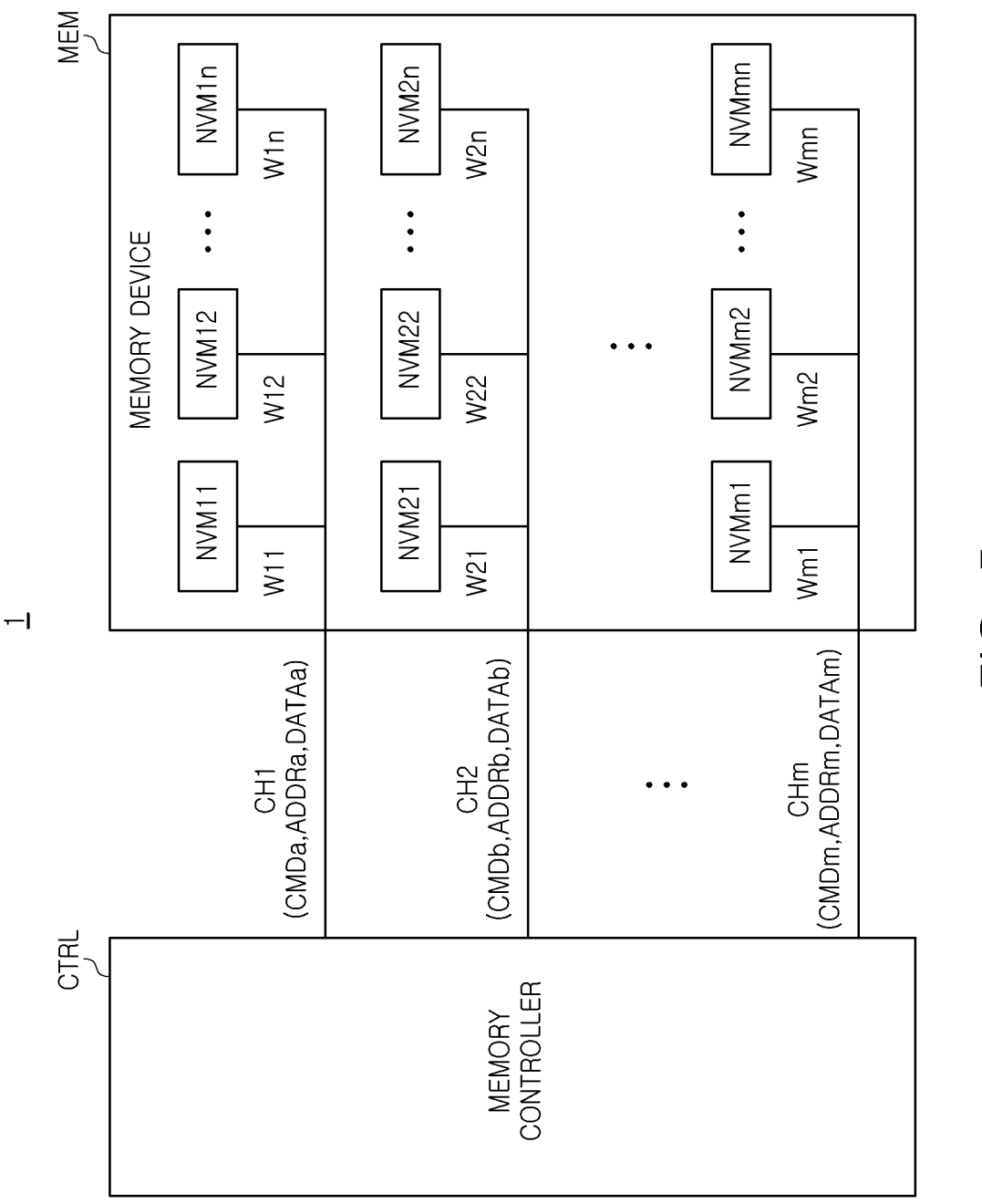
FIG. 5 is a block diagram illustrating a memory system including a memory device according to an embodiment.

FIG. 5 is a block diagram illustrating a memory system including the memory device according to an example embodiment of the present disclosure.

Referring to FIG. 5, a memory system 1 may include a memory device MEM and a memory controller CTRL. The memory system 1 may support the plurality of channels CH1 to CHm, and the memory device MEM and the memory controller CTRL may be connected through a plurality of channels CH1 to CHm. For example, the memory system 1 may be implemented as a storage device such as a solid state drive (SSD).

The memory device MEM may include a plurality of nonvolatile memory devices NVM11 to NVMmn. Each of the nonvolatile memory devices NVM11 to NVMmn may be connected to one of the plurality of channels CH1 to CHm through a corresponding connection. For example, the nonvolatile memory devices NVM11 to NVM1$n$ may be connected to a first channel CH1 through connections W11 to W1n, and the nonvolatile memory devices NVM21 to NVM2$n$ may be connected to a second channel CH2 through connections W21 to W2$n$. In an exemplary example embodiment, each of the nonvolatile memory devices NVM11 to NVMmn may be implemented as an arbitrary memory unit capable of operating according to an individual command from the memory controller CTRL. For example, each of the nonvolatile memory devices NVM11 to NVMmn may be implemented as a chip or a die, but the present disclosure is not limited thereto.

The memory controller CTRL may transmit/receive signals to and from the memory device MEM through the plurality of channels CH1 to CHm. For example, the memory controller CTRL may transmit commands CMDa to CMDm, addresses ADDRa to ADDRm, and data DATAa to DATAm to the memory device MEM through the channels CH1 to CHm, or receive the data DATAa to DATAm from the memory device MEM.

The memory controller CTRL may selection one of the nonvolatile memory devices NVM11 to NVMmn connected to the corresponding channel through each channel, and may transmit and receive signals to and from the selected nonvolatile memory device. For example, the memory controller CTRL may selection the nonvolatile memory device NVM11 from the nonvolatile memory devices NVM11 to NVM1$n$ connected to the first channel CH1. The memory controller CTRL may transmit a command CMDa, an address ADDRa, and data DATAa to the selected nonvolatile memory device NVM11 through the first channel CH1 or receive the data DATAa from the selected nonvolatile memory device NVM11.

The memory controller CTRL may transmit and receive signals to and from the memory device MEM in parallel through different channels. For example, the memory controller CTRL may transmit a command CMDb to the memory device MEM through the second channel CH2 while transmitting the command CMDa to the memory device MEM through the first channel CH1. For example, the memory controller CTRL may receive data DATAb from the memory device MEM through the second channel CH2 while receiving the data DATAa from the memory device MEM through the first channel CH1.

The memory controller CTRL may control the overall operation of the memory device MEM. The memory controller CTRL may transmit signals to the channels CH1 to CHm to control each of the nonvolatile memory devices NVM11 to NVMmn connected to the channels CH1 to CHm. For example, the memory controller CTRL may transmit the command CMDa and address ADDRa to the first channel CH1 to control a selected one of the nonvolatile memory devices NVM11 to NVM1$n$.

Each of the nonvolatile memory devices NVM11 to NVMmn may operate under the control of the memory controller CTRL. For example, the nonvolatile memory device NVM11 may program the data DATAa according to the command CMDa and the address ADDRa provided to the first channel CH1. For example, the nonvolatile memory device NVM21 may read the data DATAb according to the command CMDb and the address ADDRb provided to the second channel CH2, and transmit the read data DATAb to the memory controller CTRL.

FIG. 5 shows the memory device MEM communicates with the memory controller CTRL through m channels, and the memory device MEM includes n nonvolatile memory devices corresponding to each channel, but embodiments are not limited thereto, and the number of channels and the number of nonvolatile memory devices connected to one channel may be variously changed.

Figure 6:
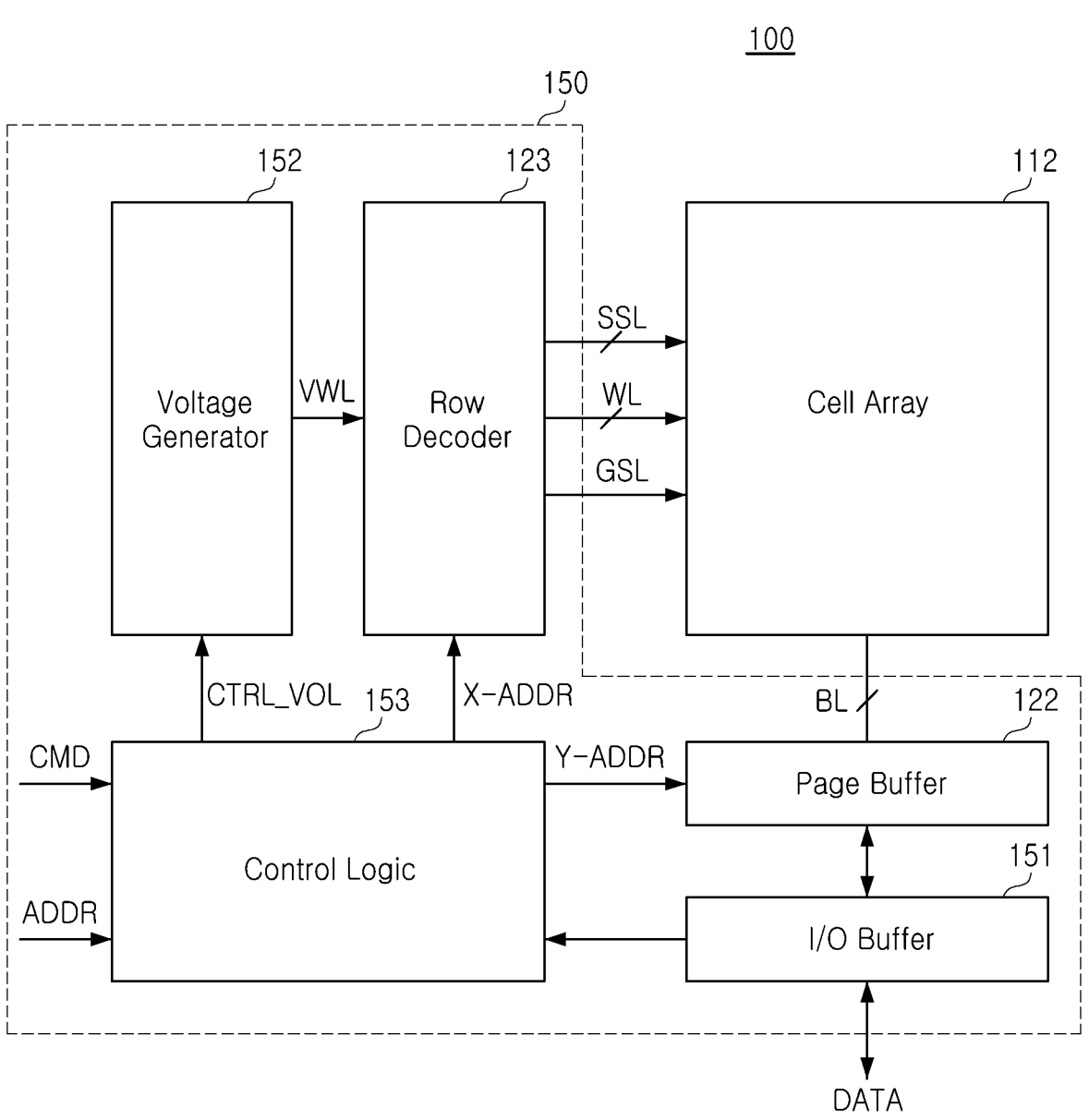
FIG. 6 is a block diagram illustrating a nonvolatile memory device according to an embodiment.

FIG. 6 is a block diagram illustrating a nonvolatile memory device according to an example embodiment of the present disclosure.

Referring to FIG. 6, the nonvolatile memory device 100 according to an example embodiment of the present disclosure may include a memory cell area including a memory cell array 112 and a peripheral circuit area including peripheral circuits 150.

The peripheral circuits 150 disposed in the peripheral circuit area of the nonvolatile memory device 100 may include a row decoder 123, a page buffer 122, an input/output (I/O) buffer 151, a voltage generator 152, and a control logic circuit 153. In embodiments, the nonvolatile memory device 100 may further include column logic, a pre-decoder, a temperature sensor, and the like.

The control logic circuit 153 may generally control various operations in a nonvolatile memory device. The control logic circuit 153 may output various control signals in response to the command CMD and/or the address ADDR input from a memory controller. For example, the control logic circuit 153 may output a voltage control signal CTRL_VOL, a row address X-ADDR, and a column address Y-ADDR.

The memory cell array 112 may include a plurality of memory blocks, and each of the plurality of memory blocks may include a plurality of memory cells. The memory cell array 112 may be connected to the page buffer 122 through bit lines BL, and connected to a row decoder 123 through word lines WL, string selection lines SSL, and ground selection lines GSL.

In the nonvolatile memory device 100 according to an example embodiment of the present disclosure, the memory cell array 112 may include a 3D memory cell array, and the 3D memory cell array may include a plurality of NAND strings. Each NAND string may include a plurality of memory cells respectively connected to word lines WL stacked vertically on a substrate. U.S. Pat. Nos. 7,679,133, 8,553,466, 8,654,587, 8,559,235, and U.S. Patent Application Publication No. 2011/0233648 are incorporated herein by reference in their entirety. For example, the memory cell array 112 may include a 2-dimensional (2D) memory cell array, and the 2D memory cell array may include a plurality of NAND strings disposed along a row direction and a column direction.

The page buffer 122 may include a plurality of page buffers, and the plurality of page buffers may be respectively connected to a plurality of memory cells through a plurality of bit lines BL. The page buffer 122 may select at least one of the bit lines BL in response to a column address Y-ADDR. The page buffer 122 may operate as a write driver or a sense amplifier according to an operation mode. For example, during the write operation, the page buffer 122 may apply a bit line voltage corresponding to data to be written to the selected bit line. During the read operation, the page buffer 122 may sense data stored in the plurality of memory cells by sensing a current or voltage of the selected bit line.

The voltage generator 152 may generate various types of voltages for performing write, read, write verify, and erase operations based on the voltage control signal CTRL_VOL. For example, the voltage generator 152 may generate a write voltage, a read voltage, a write verify voltage, an erase voltage, etc., as a word line voltage VWL.

The row decoder 123 may selection one of the plurality of word lines WL in response to the row address X-ADDR and selection one of the plurality of string selection lines SSL. For example, the row decoder 123 may apply the write voltage and the write verify voltage to the selected word line during the write operation, and apply the read voltage to the selected word line during the read operation.

Figure 7:
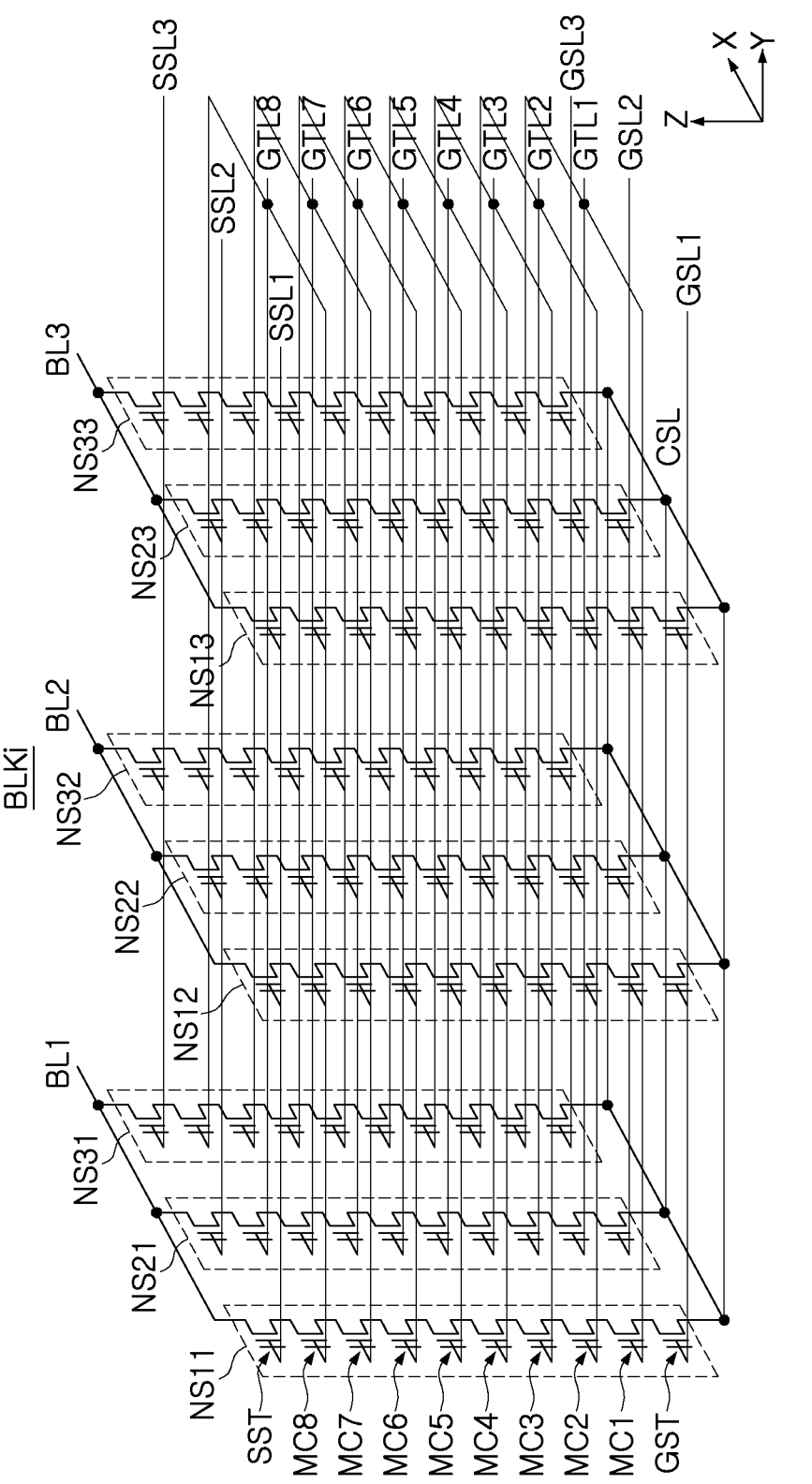
FIG. 7 is an equivalent circuit diagram of a memory block included in the nonvolatile memory device according to an embodiment.

FIG. 7 is an equivalent circuit diagram of a memory block included in the nonvolatile memory device according to an example embodiment of the present disclosure.

A memory block BLKi illustrated in FIG. 7 represents a three-dimensional memory block formed on a semiconductor substrate in a three-dimensional structure. For example, a plurality of memory NAND strings included in the memory block BLKi may be formed in a direction perpendicular to the semiconductor substrate.

Figure 8:
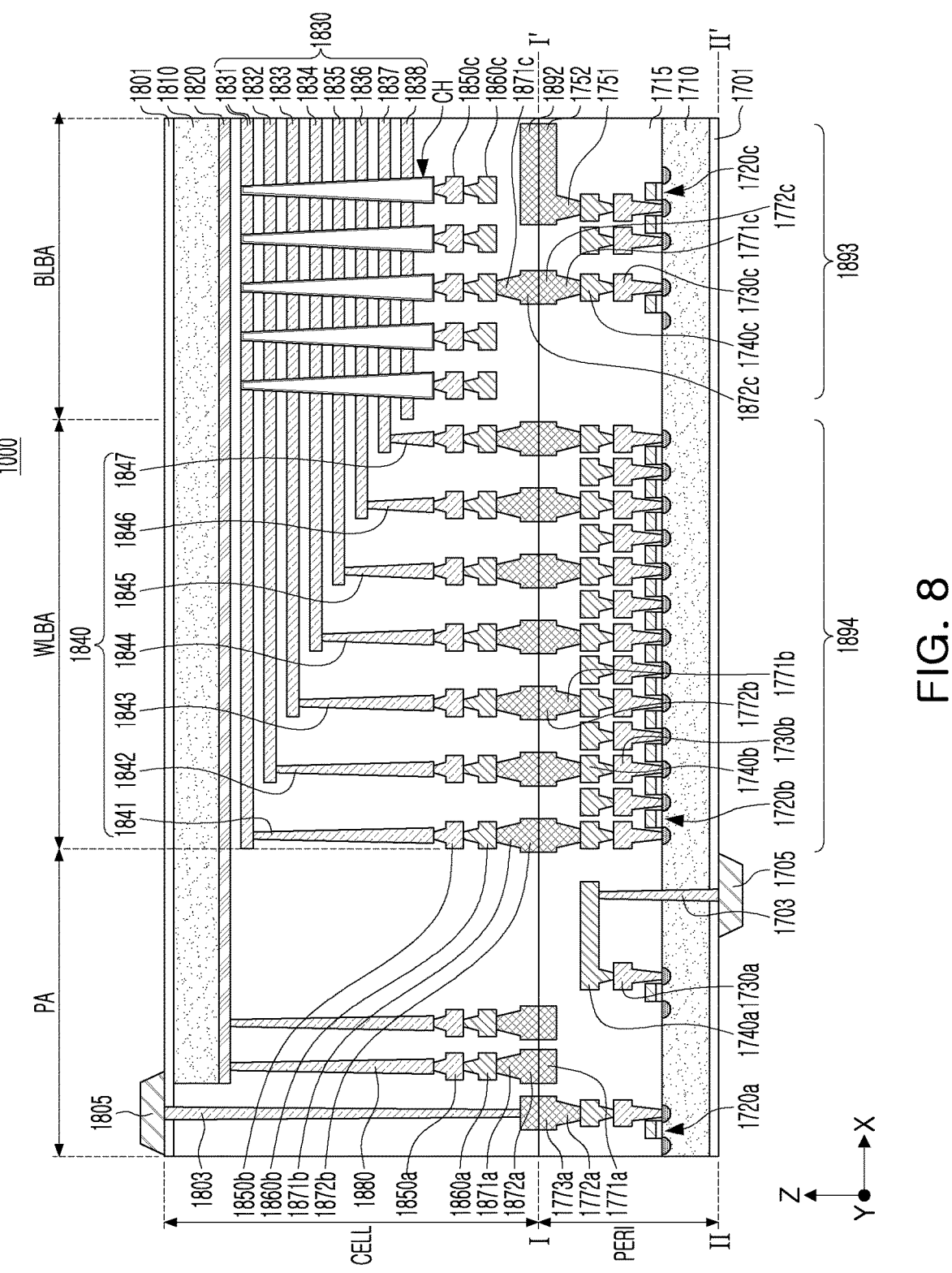
FIG. 8 is a diagram for describing a wafer bonding method in the nonvolatile memory device according to an embodiment.

Referring to FIG. 7, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1, MC2, . . . , MC8, and a ground selection transistor GST. FIG. 8 shows each of the plurality of memory NAND strings NS11 to NS33 includes eight memory cells MC1, MC2, . . . , MC8, but embodiments are not limited thereto.

The string selection transistor SST may be connected to the corresponding string selection lines SSL1, SSL2, and SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to word lines, and some of the gate lines GTL1, GTL2, . . . , GTL8 may correspond to dummy word lines. The ground selection transistor GST may be connected to the corresponding ground selection lines GSL1, GSL2, and GSL3. The string selection transistor SST may be connected to the corresponding bit lines BL1, BL2, and BL3, and the ground selection transistor GST may be connected to the common source line CSL.

Word lines (e.g., WL1) having the same height are commonly connected, and the ground selection lines GSL1, GSL2, and GSL3 and the string selection lines SSL1, SSL2, and SSL3 may each be separated from each other. FIG. 7 shows the memory block BLK connected to eight gate lines GTL1, GTL2, . . . , GTL8 and three bit lines BL1, BL2, and BL3, but embodiments are not limited thereto.

FIG. 8 is a diagram for describing a wafer bonding method in the nonvolatile memory device according to an example embodiment of the present disclosure.

Referring to FIG. 8, a nonvolatile memory device 1000 may have a chip to chip (C2C) structure. Here, the C2C structure may mean that an upper chip including a cell area CELL is manufactured on a first wafer, and a lower chip including a peripheral circuit area PERI is manufactured on a second wafer different from the first wafer, and then the upper chip and the lower chip are connected to each other by a bonding method. For example, the bonding method may refer to a method of electrically connecting a bonding metal formed on an uppermost metal layer of the upper chip and a bonding metal formed on an uppermost metal layer of the lower chip. For example, when the bonding metal is formed of copper (Cu), the bonding method may be a Cu-to-Cu bonding method, and the bonding metal may also be formed of aluminum (Al) or tungsten (W).

Referring to FIGS. 2 and 3 together, a cell area CELL included on a first semiconductor substrate 1810 of the nonvolatile memory device 1000 may correspond to the memory cell area 112, and may be included in the first semiconductor structure 110. In embodiments, the peripheral circuit area PERI included on a second semiconductor substrate 1710 may correspond to peripheral circuits and may correspond to the second semiconductor structure 120 and the third semiconductor structure 130. In addition, the bonding metal may correspond to the first metal pad 119 and the second metal pad 129.

Each of the peripheral circuit area PERI and the cell area CELL of the nonvolatile memory device 1000 may include an outer pad bonding area PA, a word line bonding area WLBA, and a bit line bonding area BLBA.

The peripheral circuit area PERI may include the second semiconductor substrate 1710, an interlayer insulating layer 1715, a plurality of circuit elements 1720a, 1720b, and 1720c formed on the second semiconductor substrate 1710, first metal layers 1730a, 1730b, and 1730c connected to the plurality of circuit elements 1720a, 1720b, and 1720c, respectively, and second metal layers 1740a, 1740b, and 1740c formed on the first metal layers 1730a, 1730b, and 1730c. In an example embodiment, the first metal layers 1730a, 1730b, and 1730c may be formed of tungsten having a relatively high electrical specific resistance, and the second metal layers 1740a, 1740b, and 1740c may be formed of copper having a relatively low electrical specific resistance.

In the present specification, only the first metal layers 1730a, 1730b, 1730c and the second metal layers 1740a, 1740b, and 1740c are illustrated and described, but not limited thereto, and at least one metal layer may be further formed on the second metal layers 1740a, 1740b, and 1740c. At least some of the one or more metal layers formed above the second metal layers 1740a, 1740b, and 1740c may be formed of aluminum having a different specific resistance, etc., than that of copper forming the second metal layers 1740a, 1740b, and 1740c.

The interlayer insulating layer 1715 may be disposed on the second semiconductor substrate 1710 to cover the plurality of circuit elements 1720a, 1720b, and 1720c, the first metal layers 1730a, 1730b, and 1730c, and the second metal layers 1740a, 1740b, and 1740c, and may include an insulating material such as silicon oxide or silicon nitride.

Lower bonding metals 1771b and 1772b may be formed on the second metal layer 1740b of a word line bonding area WLBA. In the word line bonding area WLBA, the lower bonding metals 1771b and 1772b of the peripheral circuit area PERI may be electrically connected to upper bonding metals 1871b and 1872b of the cell area CELL by the bonding method, and the lower bonding metals 1771b and 1772b and the upper bonding metals 1871b and 1872b may be formed of aluminum, copper, tungsten, or the like.

The cell area CELL may provide at least one memory block. The cell area CELL may include the first semiconductor substrate 1810 and a common source line 1820. A plurality of word lines 1830, which may include for example word line 1831, word line 1832, word line 1833, word line 1834, word line 1835, word line 1836, word line 1837, and word line 1838, may be stacked on the first semiconductor substrate 1810 along a direction (Z-axis direction) perpendicular to an upper surface of the first semiconductor substrate 1810. String selection lines and a ground selection line may be disposed above and under the word lines 1830, respectively, and the plurality of word lines 1830 may be disposed between the string selection lines and the ground selection line.

In the bit line bonding area BLBA, the channel structure CH may extend in a direction (Z-axis direction) perpendicular to the upper surface of the first semiconductor substrate 1810 to penetrate through the word lines 1830, the string selection lines, and the ground selection line. The channel structure CH may include a data storage layer, a channel layer, and a buried insulating layer, and the channel layer may be electrically connected to a first metal layer 1850c and a second metal layer 1860c. For example, the first metal layer 1850c may be a bit line contact, and the second metal layer 1860c may be a bit line. In an example embodiment, the second metal layer 1860c (which may be a bit line) may extend in a third direction (e.g., Y-direction) parallel to an upper surface of the first semiconductor substrate 1810.

In an example embodiment illustrated in FIG. 8, an area in which the channel structure CH, the second metal layer 1860c (which may be a bit line), and the like are disposed may be defined as a bit line bonding area BLBA. The second metal layer 1860c (which may be a bit line) may be electrically connected to the circuit elements 1720c providing a page buffer 1893 in the peripheral circuit area PERI in the bit line bonding area BLBA. For example, the second metal layer 1860c (which may be a bit line) may be connected to the upper bonding metals 1871c and 1872c in the peripheral circuit area PERI, and the upper bonding metals 1871c and 1872c may be connected to the lower bonding metals 1771B and 1772b that are connected to the circuit elements 1720c of the page buffer 1893.

In the word line bonding area WLBA, the word lines 1830 may extend along the second direction (e.g., X-axis direction) parallel to the upper surface of the first semiconductor substrate 1810 while being perpendicular to the third direction, and may be connected to a plurality of cell contact plugs 1840, which may include cell contact plug 1841, contact plug 1842, cell contact plug 1843, cell contact plug 1844, cell contact plug 1845, cell contact plug 1846, and cell contact plug 1847. The word lines 1830 and the cell contact plugs 1840 may be connected to each other through pads provided by at least some of the word lines 1830 extending in different lengths along the second direction. A first metal layer 1850b and a second metal layer 1860b may be sequentially connected to the cell contact plugs 1840 connected to the word lines 1830. The cell contact plugs 1840 may be connected to the peripheral circuit area PERI through the upper bonding metals 1871b and 1872b of the cell area CELL in the word line bonding area WLBA and the lower bonding metal 1771b and 1772b of the peripheral circuit area PERI.

The cell contact plugs 1840 may be electrically connected to the circuit elements 1720b forming the row decoder 1894 in the peripheral circuit area PERI. The operating voltage of the circuit elements 1720b providing the row decoder 1894 may be different from that of the circuit elements 1720c forming the page buffer 1893. For example, the operating voltage of the circuit elements 1720c forming the page buffer 1893 may be greater than that of the circuit elements 1720b forming the row decoder 1894.

A common source line contact plug 1880 may be disposed in the outer pad bonding area PA. The common source line contact plug 1880 may be formed of a metal, a metal compound, or a conductive material such as polysilicon, and may be electrically connected to the common source line 1820. A first metal layer 1850a and a second metal layer 1860a may be sequentially stacked above the common source line contact plug 1880. For example, an area in which the common source line contact plug 1880, the first metal layer 1850a, and the second metal layer 1860a are disposed may be defined as the outer pad bonding area PA.

In embodiments, first input/output pad 1805 and second input/output pad 1705 may be disposed in the outer pad bonding area PA. Referring to FIG. 8, a lower insulating film 1701 covering a lower surface of the second semiconductor substrate 1710 may be formed under the second semiconductor substrate 1710, and the second input/output pad 1705 may be formed on the lower insulating film 1701. The second input/output pad 1705 may be connected to at least one of the plurality of circuit elements 1720a, 1720b, and 1720c disposed in the peripheral circuit area PERI through the second input/output contact plug 1703, and may be separated from the second semiconductor substrate 1710 by the lower insulating film 1701. In addition, because a side insulating film may be disposed between the second input/output contact plug 1703 and the second semiconductor substrate 1710, the second input/output contact plug 1703 and the second semiconductor substrate 1710 may be electrically separated from each other.

Referring to FIG. 8, an upper insulating film 1801 covering an upper surface of the first semiconductor substrate 1810 may be formed above the first semiconductor substrate 1810, and the first input/output pad 1805 may be disposed on the upper insulating film 1801. The first input/output pad 1805 may be connected to at least one of the plurality of circuit elements 1720a, 1720b, and 1720c disposed in the peripheral circuit area PERI through a first input/output contact plug 1803. In an example embodiment, the first input/output pad 1805 may be electrically connected to the circuit element 1720a.

In an example embodiment, the first semiconductor substrate 1810, the common source line 1820, and the like may not be disposed in the area where the first input/output contact plug 1803 is disposed. In addition, the first input/output pad 1805 may not overlap with the word lines 1830 in the first direction (e.g., Z-axis direction). Referring to FIG. 8, the first input/output contact plug 1803 may be separated from the first semiconductor substrate 1810 in a direction parallel to the upper surface of the first semiconductor substrate 1810, and may be connected to the first input/output pad 1805 by penetrating through the interlayer insulating layer 1815 of the cell area CELL.

In some example embodiments, the second input/output pad 1705 and the first input/output pad 1805 may be selectively formed. For example, the nonvolatile memory device 1000 may include only the second input/output pad 1705 disposed above the lower insulating film 1701, or only the first input/output pad 1805 disposed above the upper insulating film 1801. In embodiments, the nonvolatile memory device 1000 may include both the second input/output pad 1705 and the first input/output pad 1805.

The metal pattern of the uppermost metal layer may exist as a dummy pattern in each of the outer pad bonding area PA and the bit line bonding area BLBA included in each of the cell area CELL and the peripheral circuit area PERI, or the uppermost metal layer may be empty.

In the nonvolatile memory device 1000, a lower metal pattern 1773a having the same shape as the upper metal pattern 1872a of the cell area CELL may be formed on the uppermost metal layer of the peripheral circuit area PERI to correspond to the upper metal pattern 1872a formed on the uppermost metal layer of the cell area CELL in the outer pad bonding area PA. The lower metal pattern 1773a formed on the uppermost metal layer of the peripheral circuit area PERI may not be connected to a separate contact in the peripheral circuit area PERI. Similarly, the upper metal pattern 1872a having the same shape as the lower metal pattern 1773a of the parallel circuit area PERI may be formed on the upper metal layer of the cell area CELL to correspond to the lower metal pattern 1773a formed on the uppermost metal layer of the peripheral circuit area PERI in the outer pad bonding area PA.

Lower bonding metals 1771b and 1772b may be formed on the second metal layer 1740b of the word line bonding area WLBA. In the word line bonding area WLBA, the lower bonding metals 1771b and 1772b of the peripheral circuit area PERI may be electrically interconnected to upper bonding metals 1871b and 1872b of the cell area CELL by the bonding method.

In addition, in the bit line bonding area BLBA, an upper metal pattern 1892 having the same shape as the lower metal pattern 1752 of the peripheral circuit area PERI may be formed on the uppermost metal layer of the cell area CELL, corresponding to the lower metal pattern 1752 formed on an uppermost metal layer of the peripheral circuit area PERI. A contact may not be formed on the upper metal pattern 1892 formed on the uppermost metal layer of the cell area CELL.

However, the nonvolatile memory device 1000 illustrated in FIG. 8 is only an example for describing the wafer bonding method, and the structure of the nonvolatile memory device 1000 according to the wafer bonding method may not be limited to that illustrated in FIG. 8.

FIGS. 9 to 12 are diagrams illustrating the nonvolatile memory device according to example embodiments of the present disclosure.

Each of the nonvolatile memory devices 200, 300, 400, 500, 600, 700, and 800 illustrated in FIGS. 9 to 12 according to an example embodiment of the present disclosure may correspond to the nonvolatile memory device 100 illustrated in FIG. 2.

In each example embodiment, the page buffer may include a plurality of vertical transistors defined by the source area, the channel area, and the drain area sequentially stacked in the first direction (e.g., Z-direction). Accordingly, by arranging the page buffer to be connected to the memory cell string one to one, even if the speed of outputting data from the page buffer is slower than the speed of applying data to the page buffer, data may be continuously stored in the empty page buffer. However, this is only an example embodiment and embodiments are not limited thereto, and the structure and arrangement of the page buffer and/or peripheral circuits may vary depending on the example embodiment.

Figure 9:
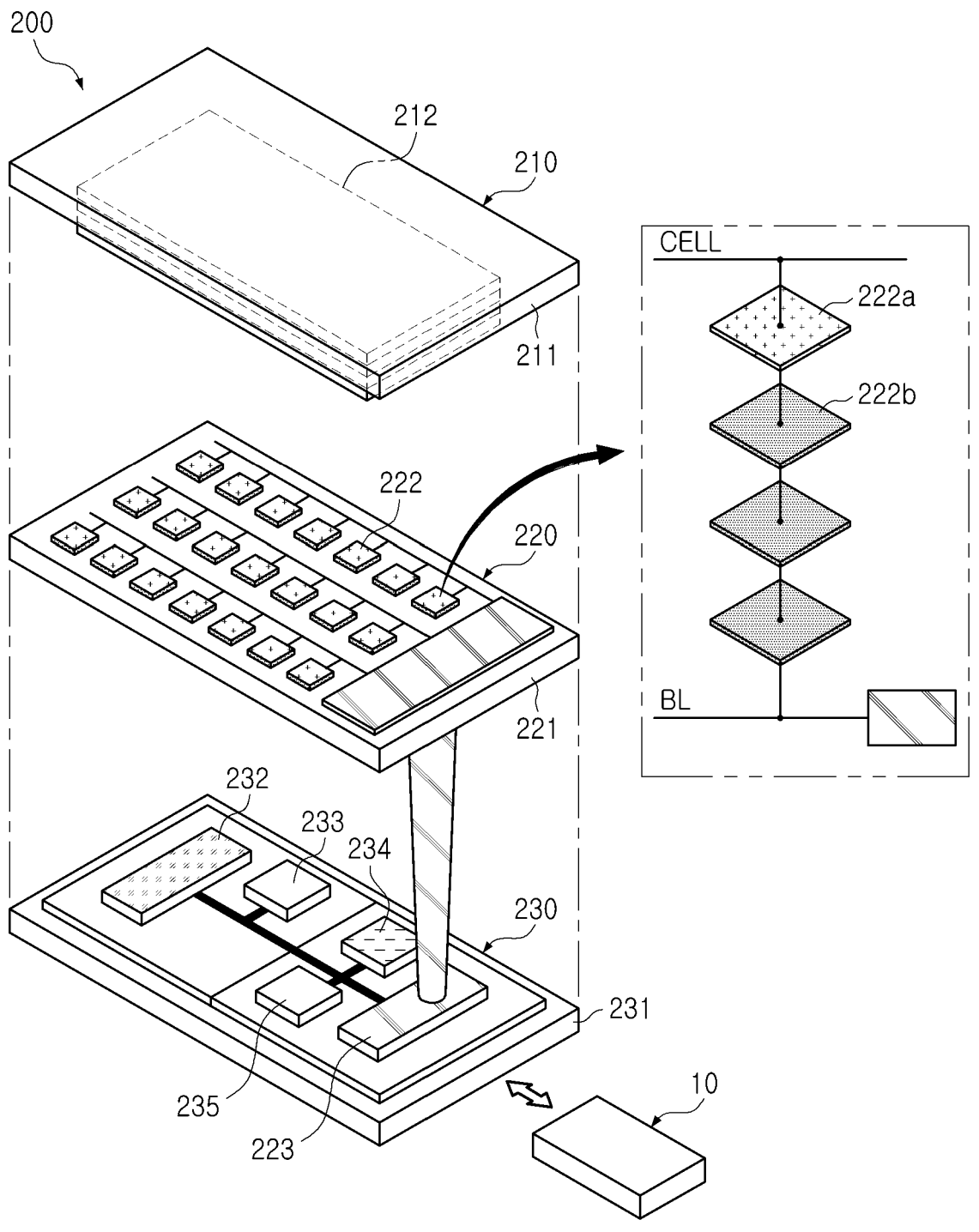
FIGS. 9 to 12 are diagrams illustrating the nonvolatile memory device according to embodiments.

Referring to FIG. 9, a nonvolatile memory device 200 may include a first semiconductor structure 210 including a first semiconductor substrate 211 and a memory cell area 212, a second semiconductor structure 220 including a second semiconductor substrate 221 and a page buffer 222, and a third semiconductor structure 230 including a third semiconductor substrate 231, a buffer memory 232, and peripheral circuits such as a row decoder 223, a sense amplifier 233, a multiplexer 235, and other peripheral circuits 234.

In embodiments, the page buffer 222 may first be connected to a connection portion of the memory cell CELL in order to sense the value of the memory cell. That is, a connection distance between the page buffer 222 and the plurality of memory cells may be shorter than a connection distance between other peripheral circuits and the plurality of memory cells.

In the nonvolatile memory device 200 according to an example embodiment of the present disclosure, the page buffer 222 may include a sensing page buffer 222a directly connected to a plurality of memory cells, and at least one general page buffer 222b connected in series with the sensing page buffer 222a.

The sensing page buffer 222a and at least one general page buffer 222b corresponding to each of the plurality of memory cells may be disposed side by side in the first direction (e.g., Z-direction). In this case, the general page buffer 222b farthest connected to the sensing page buffer 222a among the at least one general page buffer 222b may be connected to the bit line BL.

Data input from the external device 10 through the input/output interface may be stored in the buffer memory 232 and then programmed into the plurality of memory cells through the page buffer 222. However, the multiplexer 235 may determine whether to pass through the buffer memory 232 based on the characteristics of the input data.

For example, when data is stored in all memory cells included in the buffer memory 232, the multiplexer 235 may operate to store data input from the external device 10 to a plurality of memory cells without passing through the buffer memory 232. However, this is only an example embodiment and embodiments are not limited thereto, and the operation of the multiplexer 235 may vary depending on characteristics such as data capacity and access period. In addition, the multiplexer 235 may include a demultiplexer for setting a data processing path in a similar manner even in a read operation.

Figure 10:
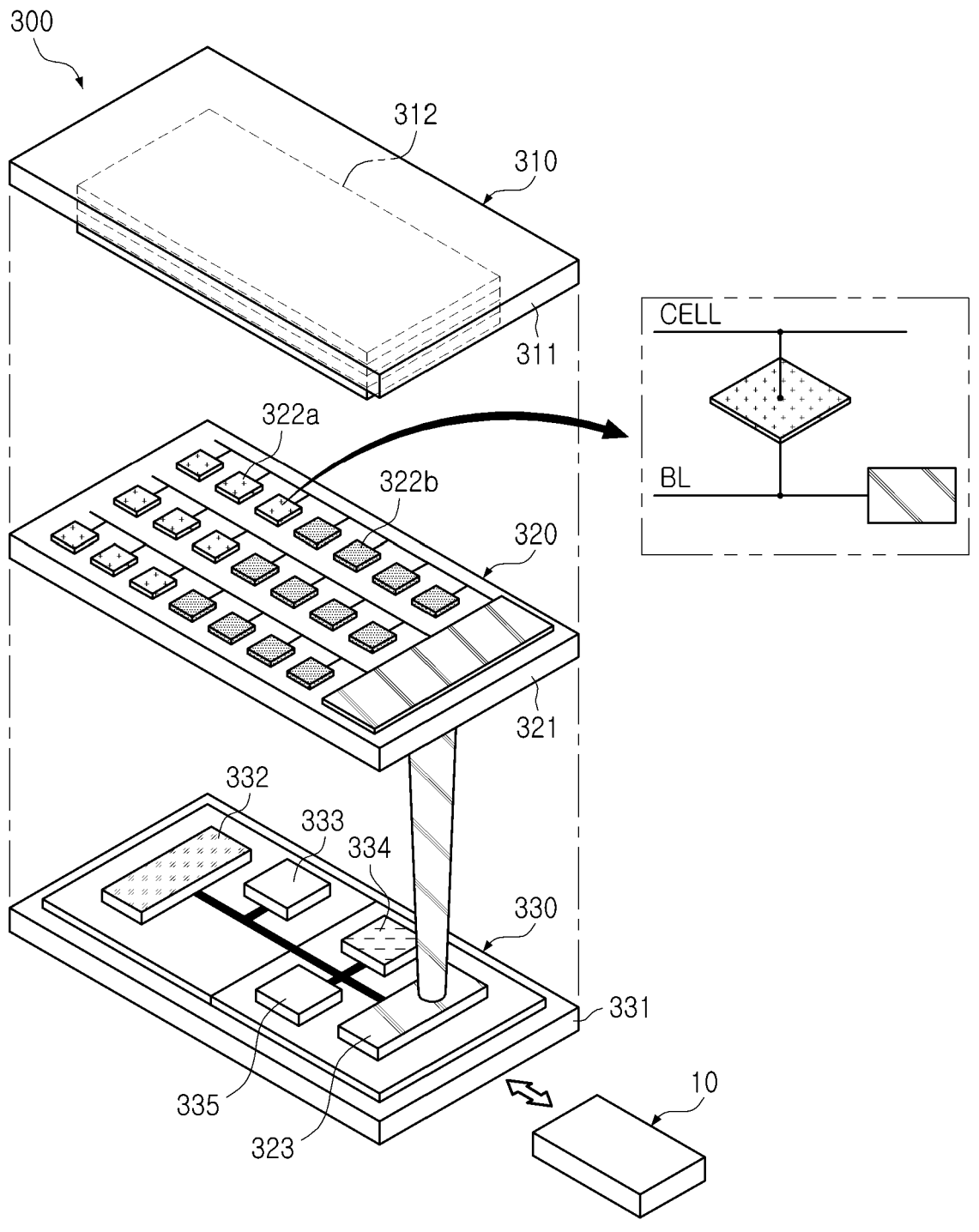
Figure 11:
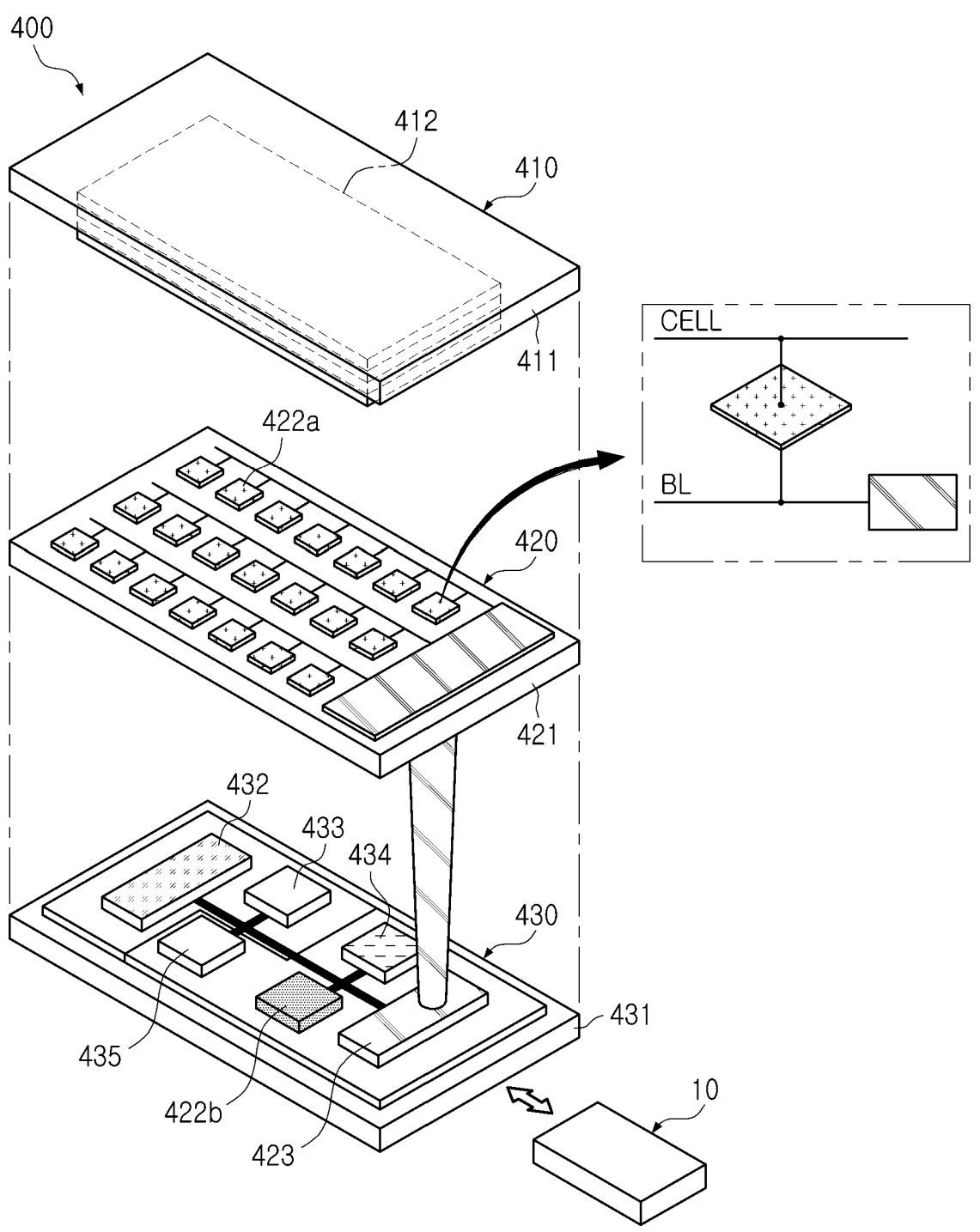

Referring to FIGS. 10 and 11, nonvolatile memory devices 300 and 400 may include first semiconductor structures 310 and 410 including first semiconductor substrates 311 and 411 and memory cell areas 312 and 412, second semiconductor structures 320 and 420 including second semiconductor substrates 321 and 421 and page buffers 322 and 422, and third semiconductor structures 330 and 430 including third semiconductor substrates 331 and 431, buffer memories 332 and 432, and peripheral circuits such as row decoders 323 and 423, sense amplifiers 333 and 433, multiplexers 335 and 435, and other peripheral circuits 334 and 434.

In the nonvolatile memory devices 300 and 400 according to example embodiments of the present disclosure, the page buffers 322 and 422 may include sensing page buffer 322a and 422a connected between the plurality of memory cells CELL and the bit line BL. In embodiments, the page buffers 322 and 422 may further include general page buffers 322*b* and 422*b* connected to the sensing page buffers 322*a* and 422*a*.

Referring to FIG. 10, the general page buffer 322*b* of the nonvolatile memory device 300 may be included in the second semiconductor structure 320. In this case, an input/output interface of the plurality of memory cells and the buffer memory 332 may be shared.

Referring to FIG. 11, the general page buffer 422*b* of the nonvolatile memory device 400 may be included in the third semiconductor structure 430. In this case, the input/output interface of the plurality of memory cells and the buffer memory 432 may be individually disposed.

Figure 12:
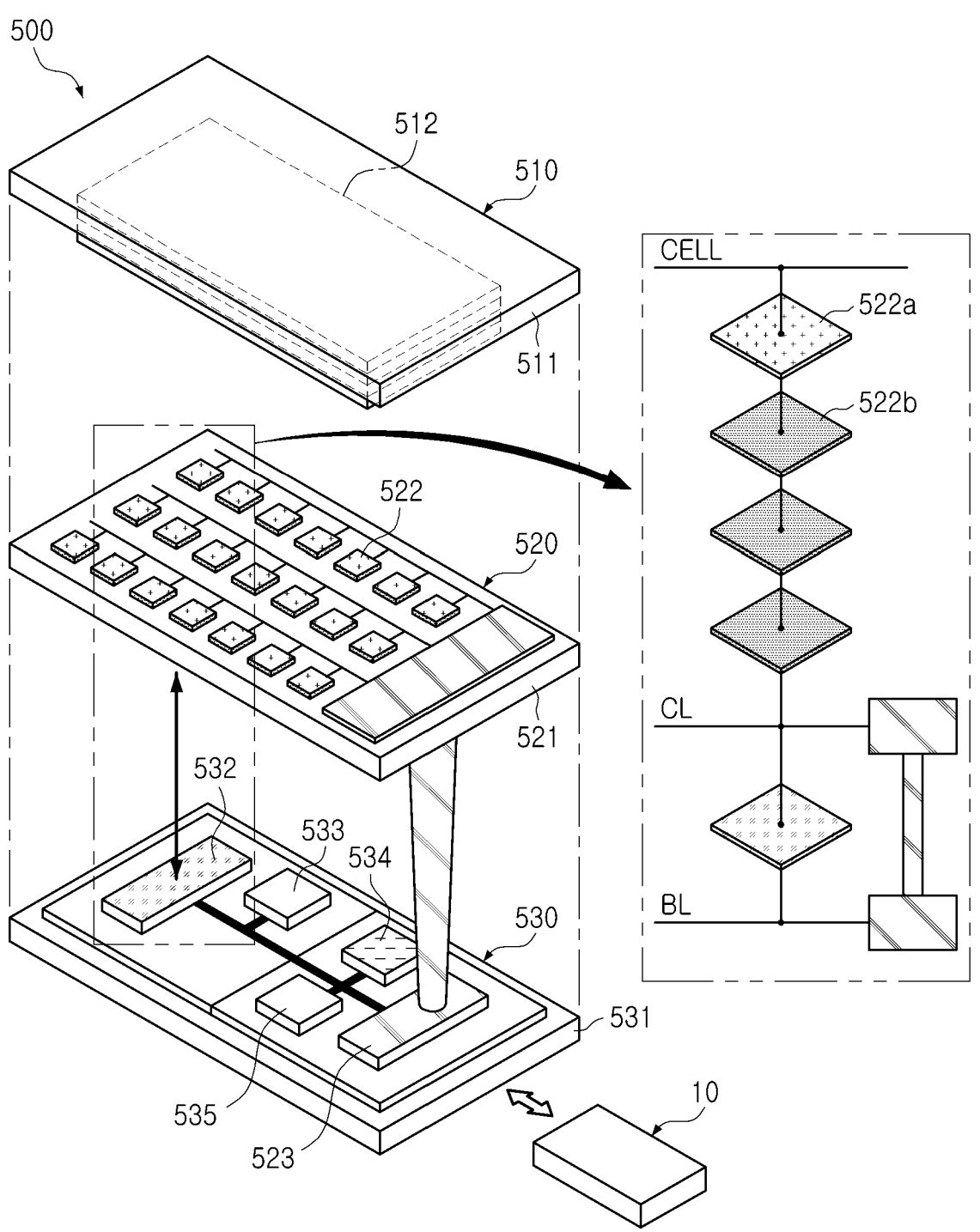

Referring to FIG. 12, a nonvolatile memory device 500 may include a first semiconductor structure 510 including a first semiconductor substrate 511 and a memory cell area 512, a second semiconductor structure 520 including a second semiconductor substrate 521 and a page buffer 522, and a third semiconductor structure 530 including a third semiconductor substrate 531, a buffer memory 532, and peripheral circuits such as a row decoder 523, a sense amplifier 533, a multiplexer 535, and other peripheral circuits 534.

In the nonvolatile memory device 500 according to an example embodiment of the present disclosure, the page buffer 522 may include a sensing page buffer 522*a* directly connected to a plurality of memory cells, and at least one general page buffer 522*b* connected in series with the sensing page buffer 522*a* in the first direction (e.g., Z-direction).

In embodiments, the page buffer 522 of the nonvolatile memory device 500 may be connected to a memory cell of the buffer memory 532 to exchange data. The data transmission may be controlled by peripheral circuits of the second semiconductor substrate 521 on which the page buffer 522 is formed. Accordingly, the general page buffer 522*b* that is farthest connected to the sensing page buffer 522*a* among at least one general page buffer 522*b* may be connected to a control line CL for controlling the data transmission. In this case, the buffer memory 532 may be connected between the control line CL and the bit line BL.

For example, a logic circuit including a buffer memory 532, a row decoder 523, and other peripheral circuits may include the plurality of vertical transistors defined by the source area, the channel area, and the drain area sequentially stacked in the first direction. However, this is only an example and embodiments are not limited thereto.

Figure 13:
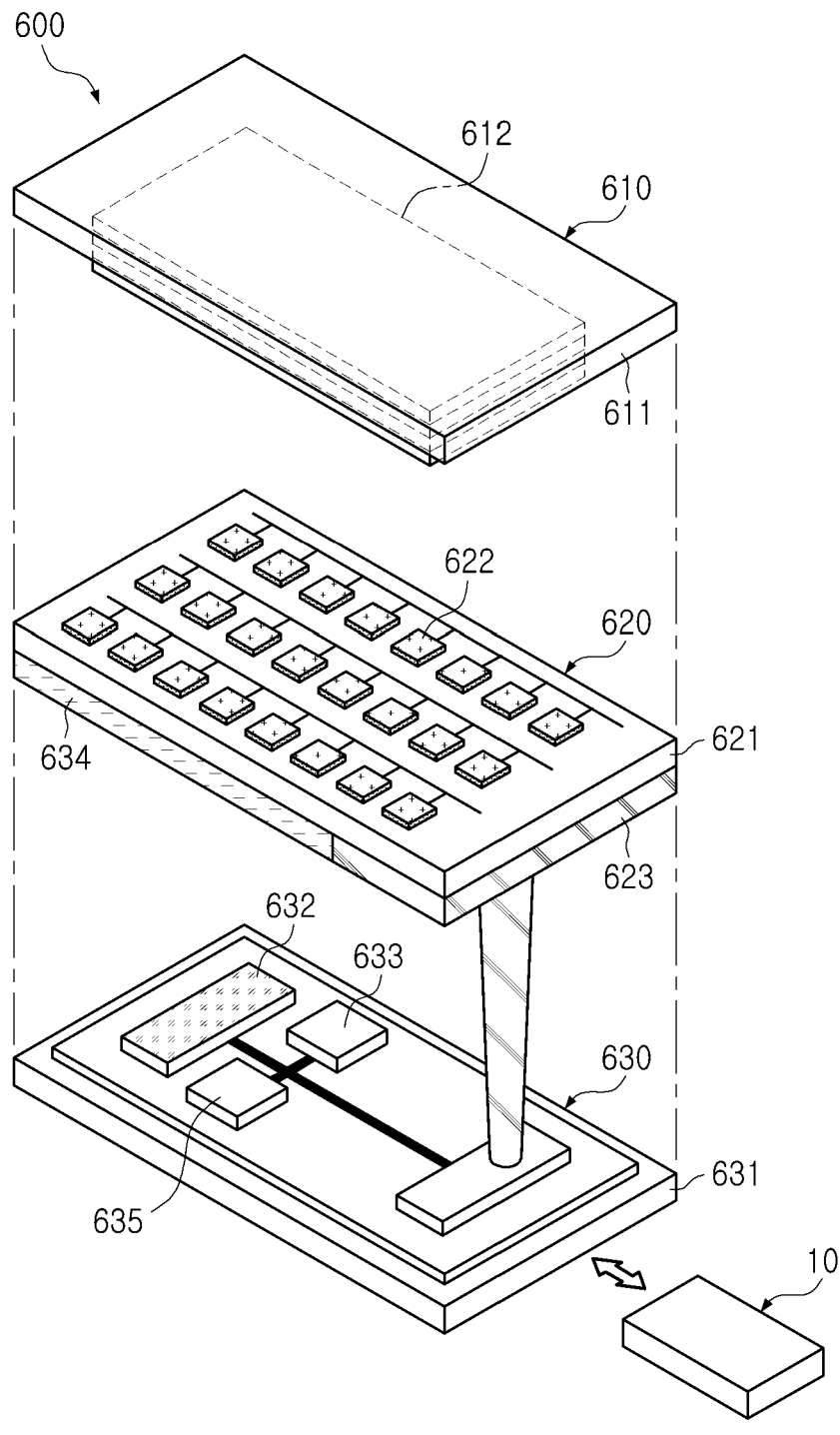
FIGS. 13 and 14 are diagrams illustrating the nonvolatile memory device according to an example embodiment.
Figure 14:
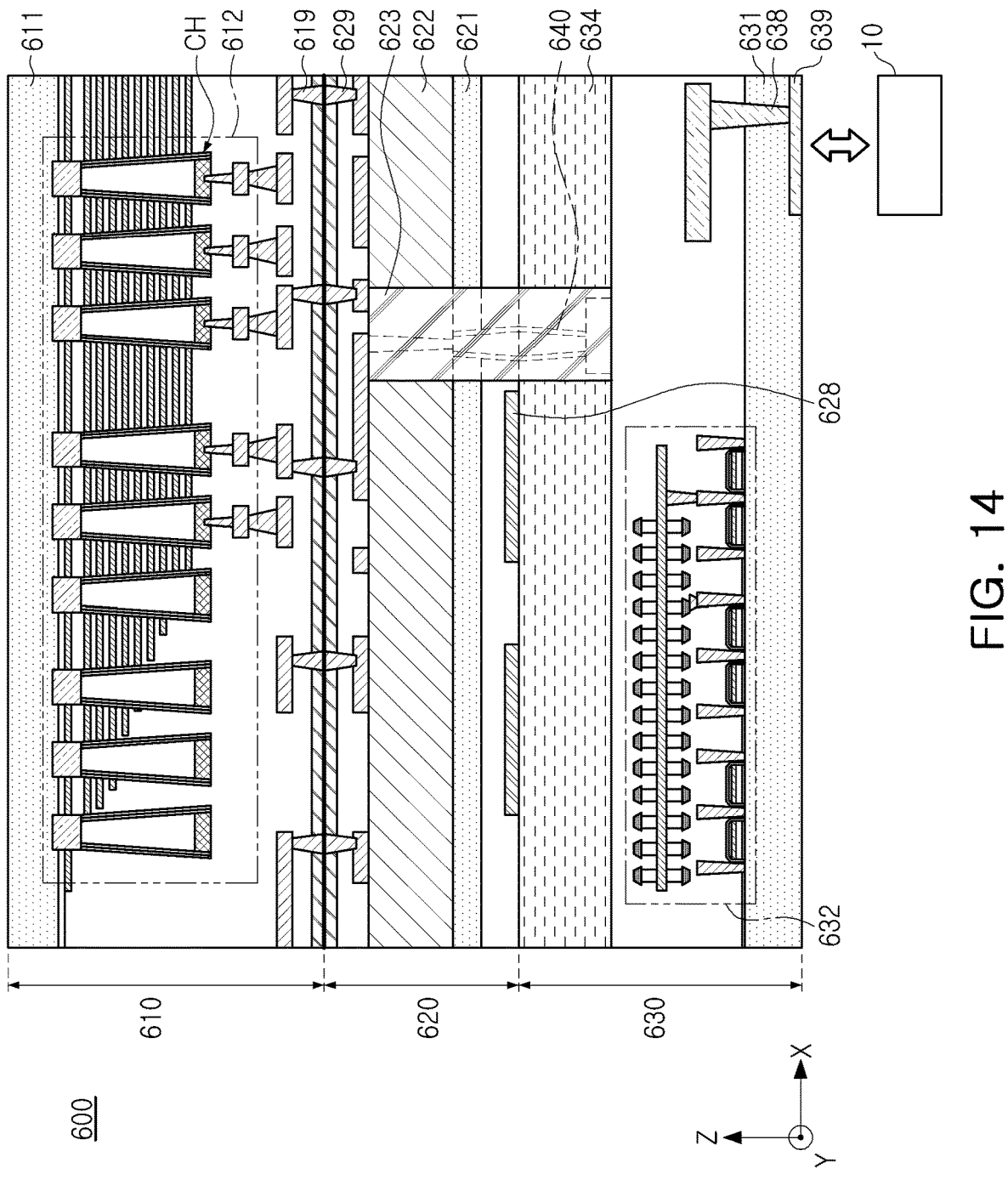
Figure 15:
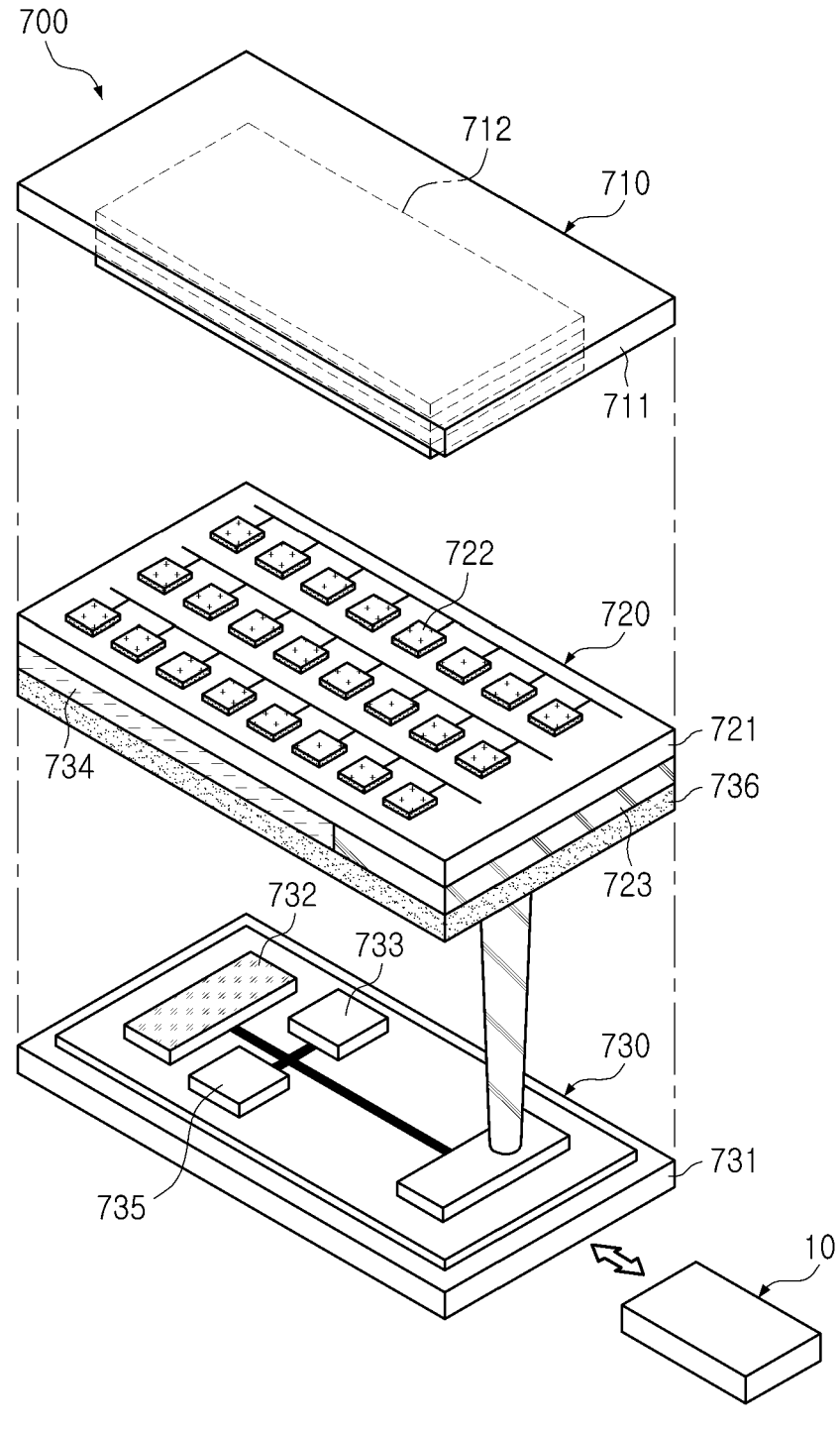
FIGS. 15 and 16 are diagrams illustrating the nonvolatile memory device according an embodiment.
Figure 16:
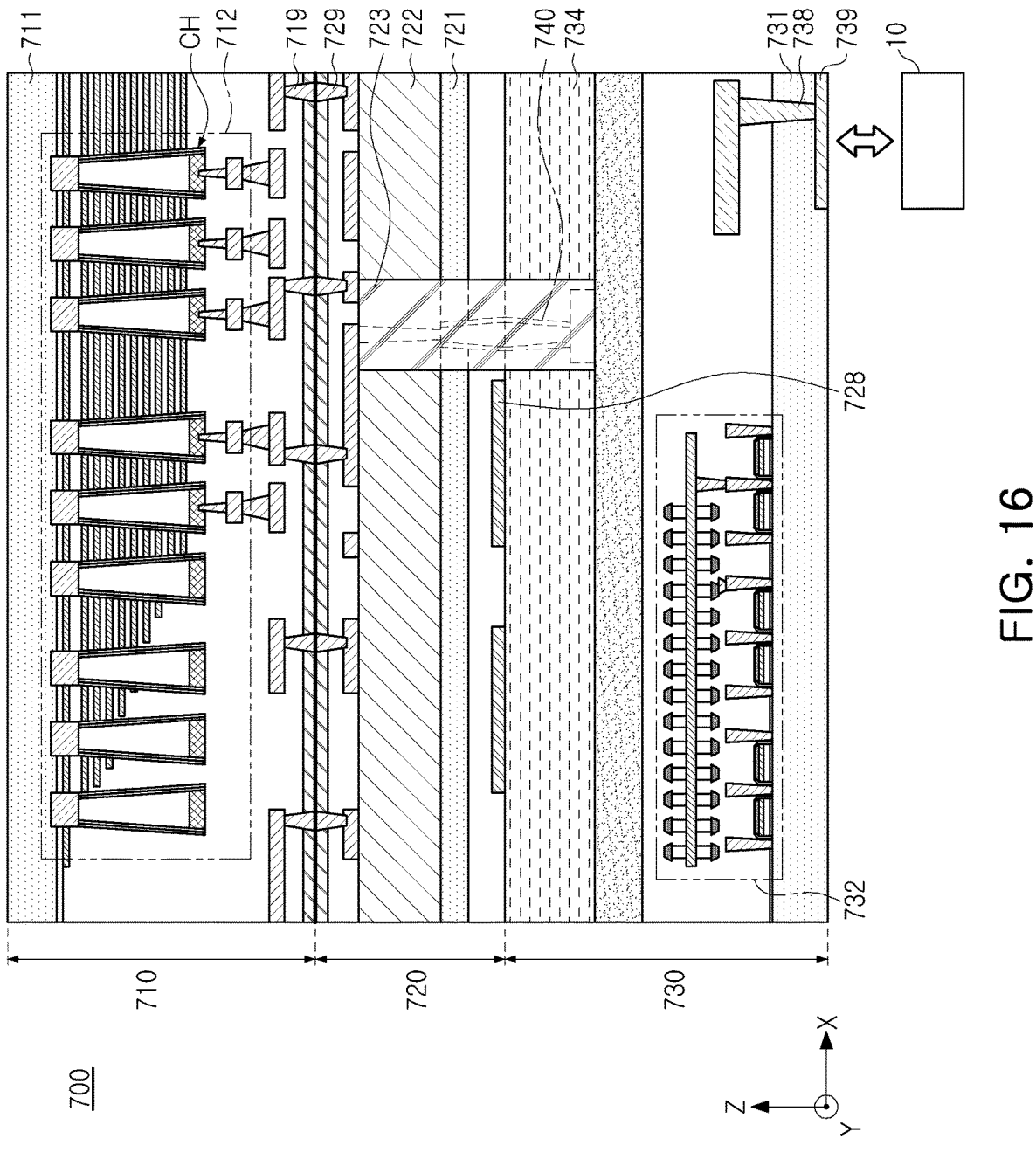
Figure 17:
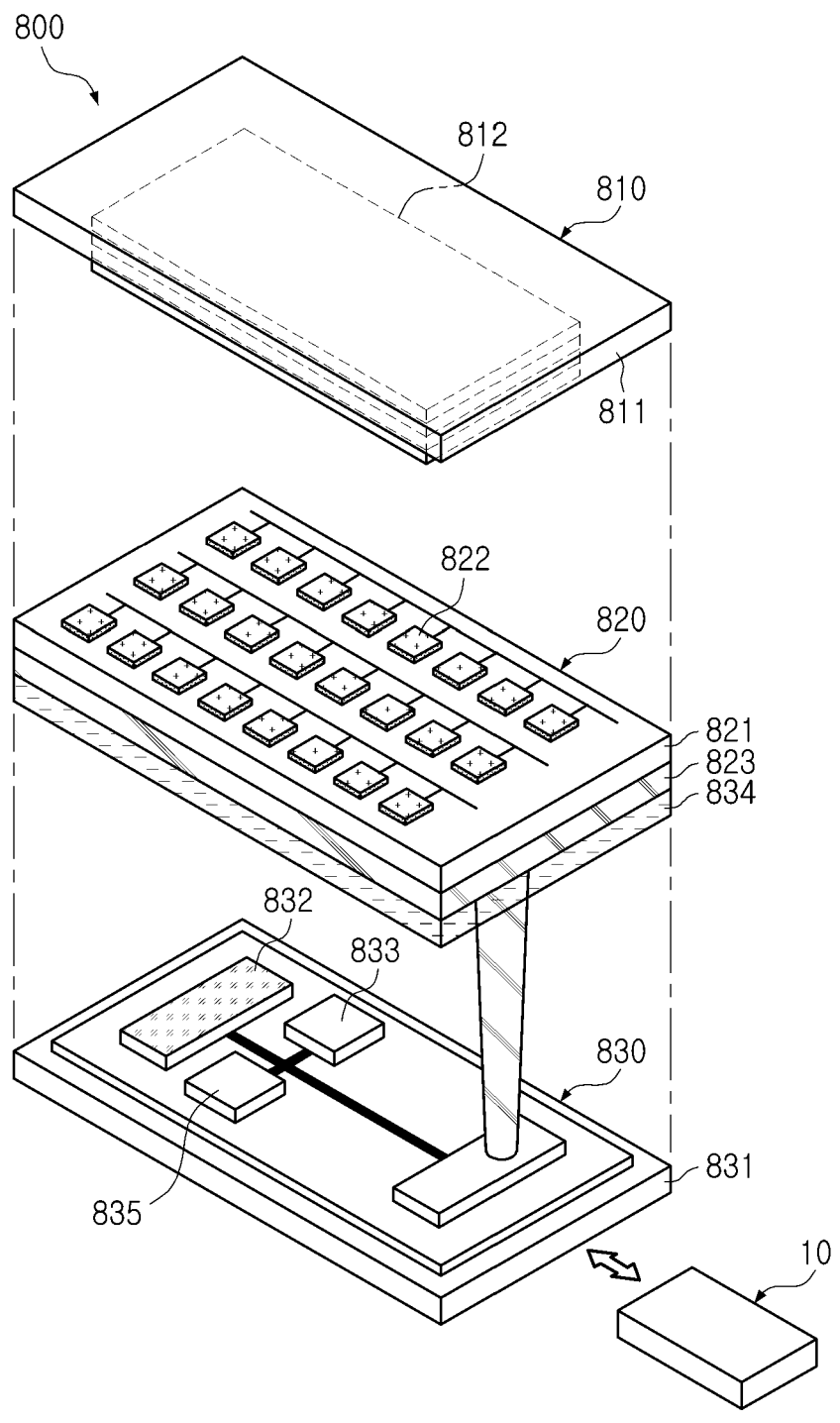
FIGS. 17 and 18 are diagrams illustrating the nonvolatile memory device according to an embodiment.
Figure 18:
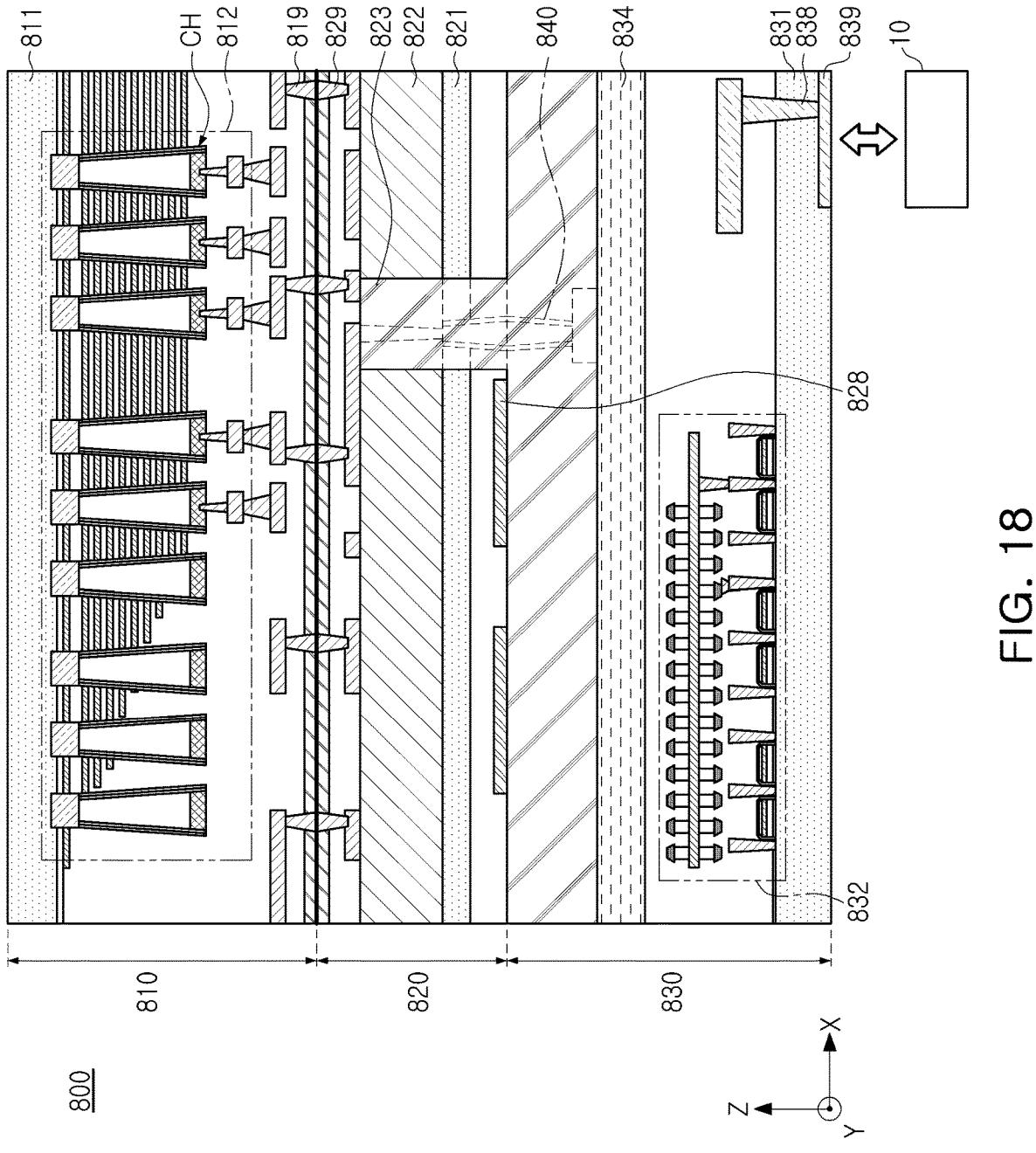

FIGS. 13 and 14 are diagrams illustrating the nonvolatile memory device according to an example embodiment of the present disclosure. FIGS. 15 and 16 are diagrams illustrating the nonvolatile memory device according to an example embodiment of the present disclosure. FIGS. 17 and 18 are diagrams illustrating the nonvolatile memory device according to an example embodiment of the present disclosure.

Referring to FIGS. 13 to 18, each of the nonvolatile memory devices 600, 700, and 800 according to example embodiments may correspond to the nonvolatile memory device 200 illustrated in FIG. 9.

In embodiments, a structure of first semiconductor structures 610, 710, and 810 including first semiconductor substrates 611, 711, and 811 and memory cell areas 612, 712, and 812, and a connection relationship between the first semiconductor structures 610 and 710, and 810, the second semiconductor structures 620, 720, and 820, and the third semiconductor structures 630, 730, and 830 may correspond to the nonvolatile memory device 100 illustrated in FIG. 3.

In embodiments, corresponding reference numerals may designate corresponding elements. For example, the first semiconductor structures 610, 710, and 810 including first semiconductor substrates 611, 711, and 811 and memory cell areas 612, 712, and 812 may correspond to first semiconductor structure 110 including first semiconductor substrate 111 and memory cell area 112. In addition, second semiconductor structures 620, 720, and 820 may correspond to second semiconductor structure 120, and third semiconductor structures 630, 730, and 830 may correspond to third semiconductor structure 130. Further, in embodiments first metal pads 619, 719, and 819 may correspond to first metal pad 119, second metal pads 629, 729, and 829 may correspond to second metal pad 129, and so on. For simplicity of description, further explanation of some duplicate elements may be omitted.

The third semiconductor structures 630, 730, and 830 included in the nonvolatile memory device 600 illustrated in FIGS. 13 and 14, the nonvolatile memory device 700 illustrated in FIGS. 15 and 16, and the nonvolatile memory device 800 illustrated in FIGS. 17 and 18, respectively, may include the plurality of vertical transistors defined by the source area, the channel area, and the drain area sequentially stacked in the first direction (e.g., Z-direction).

Referring to FIGS. 13 and 14, in the nonvolatile memory device 600 according to an example embodiment of the present disclosure, a row decoder 623 and other peripheral circuits 634 may be disposed under the second semiconductor substrate 621 on which the page buffer 622 is disposed. In this case, the row decoder 623 and other peripheral circuits 634 may include the vertical transistors defined by the source area, the channel area, and the drain area sequentially stacked in the first direction, like the page buffer 622. Other peripheral circuits 634 may receive the command CMD, address ADDR, and control CTRL signals to exchange data with an external host.

Since the size of the page buffer 622 is most affected by the increase in the storage capacity of the nonvolatile memory device 600, the page buffer 622 may be disposed in a widest area. Accordingly, in the nonvolatile memory device 600 according to an example embodiment of the present disclosure, the page buffer 622 may be formed in a wide area of the second semiconductor substrate 621, and the row decoder 623 and other peripheral circuits 634 may be disposed under the second semiconductor substrate 621, thereby maximizing the space utilization of the page buffer 622.

In embodiments, because the row decoder 623 and other peripheral circuits 634 are formed on the same layer, the increase in the length of the nonvolatile memory device 600 in the first direction may be minimized.

Referring to FIGS. 15 and 16, in the nonvolatile memory device 700 according to an example embodiment of the present disclosure, a row decoder 723 and other peripheral circuits 734 may be disposed under the second semiconductor substrate 721 on which the page buffer 722 is disposed, and additional circuits 736 may be disposed under the second semiconductor substrate 721. That is, the second semiconductor structure 720 may further include the additional circuits 736 disposed between the peripheral circuits and the buffer memory 732.

In this case, the row decoder 723, other peripheral circuits 734, and the additional circuits 736 may include the vertical transistors defined by the source area, the channel area, and the drain area sequentially stacked in the first direction, like the page buffer 722.

As an example, the additional circuits 736 may include an artificial intelligence (AI) function circuit that performs a multiply and accumulate (MAC) operation on a value stored in the page buffer 722 and/or an error correction code (ECC) function circuit that performs an error correction code (ECC) operation on a value stored in the page buffer 722, and the like. However, this is only an example embodiment and is not limited, and the additional circuits 736 may be designed to perform various functions.

In the nonvolatile memory device 700 according to an example embodiment of the present disclosure, by arranging the additional circuits 736 including vertical transistors on a layer separate from other circuits, new functions may be freely added without being limited by an area. In particular, when the function performed by the memory controller is performed by the nonvolatile memory device 700, it is possible to improve the performance of the nonvolatile memory device 700 itself.

For example, when the additional circuit 736 is the error correction code (ECC) function circuit, the additional circuit 736 may be disposed closer to the input/output interface than the page buffer 722 to perform the error detection and correction function for read data. More specifically, the additional circuit 736 may generate parity bits for write data to be written into the nonvolatile memory device 700, and the parity bits so generated may be stored in the nonvolatile memory 220 together with the write data. During the data read operation in the nonvolatile memory device 700, the additional circuit 736 may correct the error in the read data using the parity bits read together with the read data and output the error-corrected read data.

For example, when the additional circuit 736 is the artificial intelligence (AI) function circuit, the additional circuit 736 directly calculates the value output from the page buffer 722, and thus, may be disposed close to the page buffer 722. However, this is only an example and embodiments are not limited thereto.

Referring to FIGS. 17 and 18, in the nonvolatile memory device 800 according to an example embodiment of the present disclosure, a row decoder 823 may be disposed under the second semiconductor substrate 821 on which the page buffer 822 is disposed and other peripheral circuits 834 may be disposed under the second semiconductor substrate 821. That is, the row decoder 823 may be disposed on a separate layer above the other peripheral circuits 834.

FIGS. 19A to 19E are diagrams for describing a process of manufacturing a nonvolatile memory device according to an example embodiment of the present disclosure.

FIGS. 19A to 19E are diagrams illustrating a process of manufacturing the nonvolatile memory device 100 illustrated in FIGS. 2 and 3. The manufacturing process of FIGS. 19A to 19E may be similarly applied to the nonvolatile memory devices 200, 300, 400, 500, 600, 700, and 800 according to other example embodiments. However, this is only an example and embodiments are not limited thereto. For example, the first semiconductor structure 110, the second semiconductor structure 120, and the third semiconductor structure 130 included in the nonvolatile memory device 100 may be independently manufactured regardless of an order.

Figures 19A, 19B:
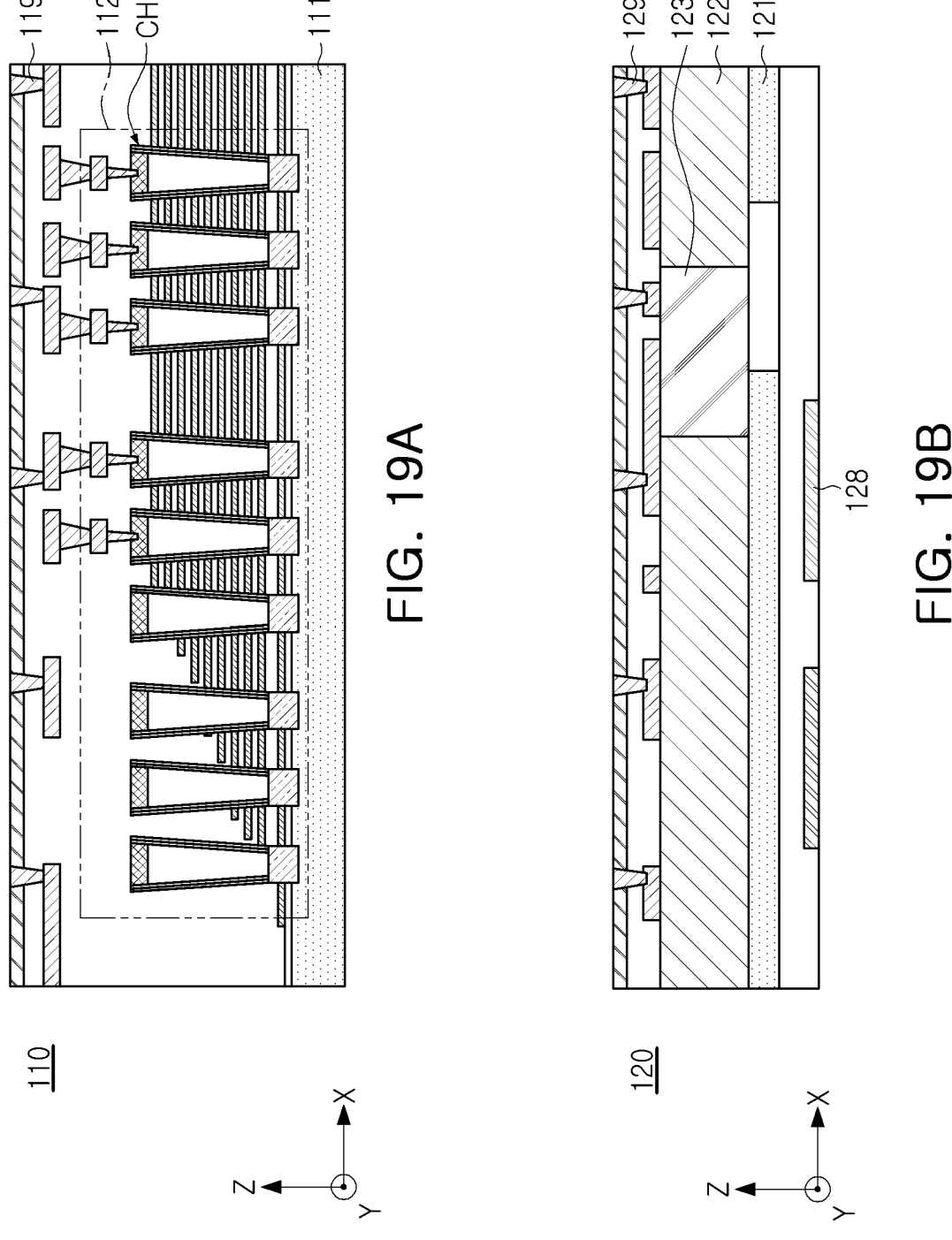
FIGS. 19A to 19E are diagrams for describing a process of manufacturing a nonvolatile memory device according to an embodiment.

Referring to FIG. 19A, in the first semiconductor structure 110, the memory cell area 112 including the gate electrodes and the channel structures CH may be formed on the first semiconductor substrate 111. In this case, a first metal pad 119 for bonding the first semiconductor structure 110 to other structures may be formed above the memory cell area 112.

Referring to FIG. 19B, in the second semiconductor structure 120, the peripheral circuit area including the page buffer 122 and the row decoder 123 may be formed on the second semiconductor substrate 121. In this case, a second metal pad 129 for bonding the second semiconductor structure 120 to the first semiconductor structure 110 may be formed above the peripheral circuit area. For example, the position of the second metal pad 129 may correspond to the position of the first metal pad 119.

As described above, a contact pad 128 for electrically connecting the page buffer 122 and/or the row decoder 123 to the external circuit may be disposed under the second semiconductor substrate 121. However, this is only an exemplary example embodiment and is not limited, and the contact pad 128 may be disposed on the lower surface of the first semiconductor substrate 111.

Figures 19C, 19D:
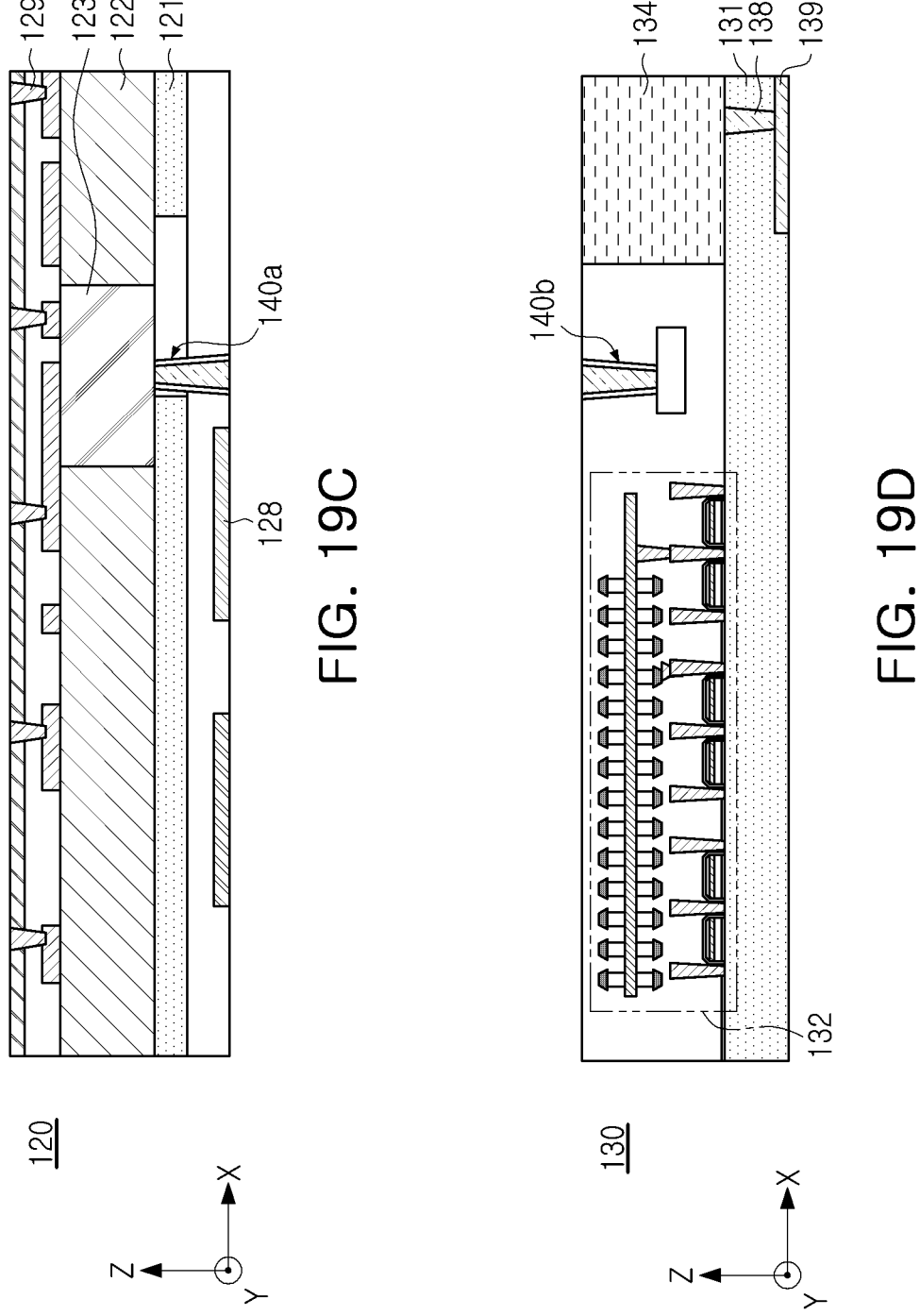

Referring to FIG. 19C, a connection structure 140a penetrating through the second semiconductor substrate 121 may be formed in the second semiconductor structure 120. For example, the connection structure 140a may be electrically connected to the row decoder 123 of the second semiconductor structure 120. However, this is only an example embodiment and embodiments are not limited thereto, and the connection structure 140a may be connected to the page buffer 122 of the second semiconductor structure 120.

Referring to FIG. 19D, in the third semiconductor structure 130, other peripheral circuits 134 connected to the third metal pad 139 through the connection via 138 penetrating through the third semiconductor substrate 131 may be formed on the third semiconductor substrate 131. In this case, the buffer memory 132 may be disposed on one side of the other peripheral circuits 134. A connection structure 140b for bonding the third semiconductor structure 130 to the second semiconductor structure 120 may be formed above the third semiconductor structure 130. For example, the position of the connection structure 140b included in the third semiconductor structure 130 may correspond to the position of the connection structure 140a included in the second semiconductor structure 120.

Figure 19E:
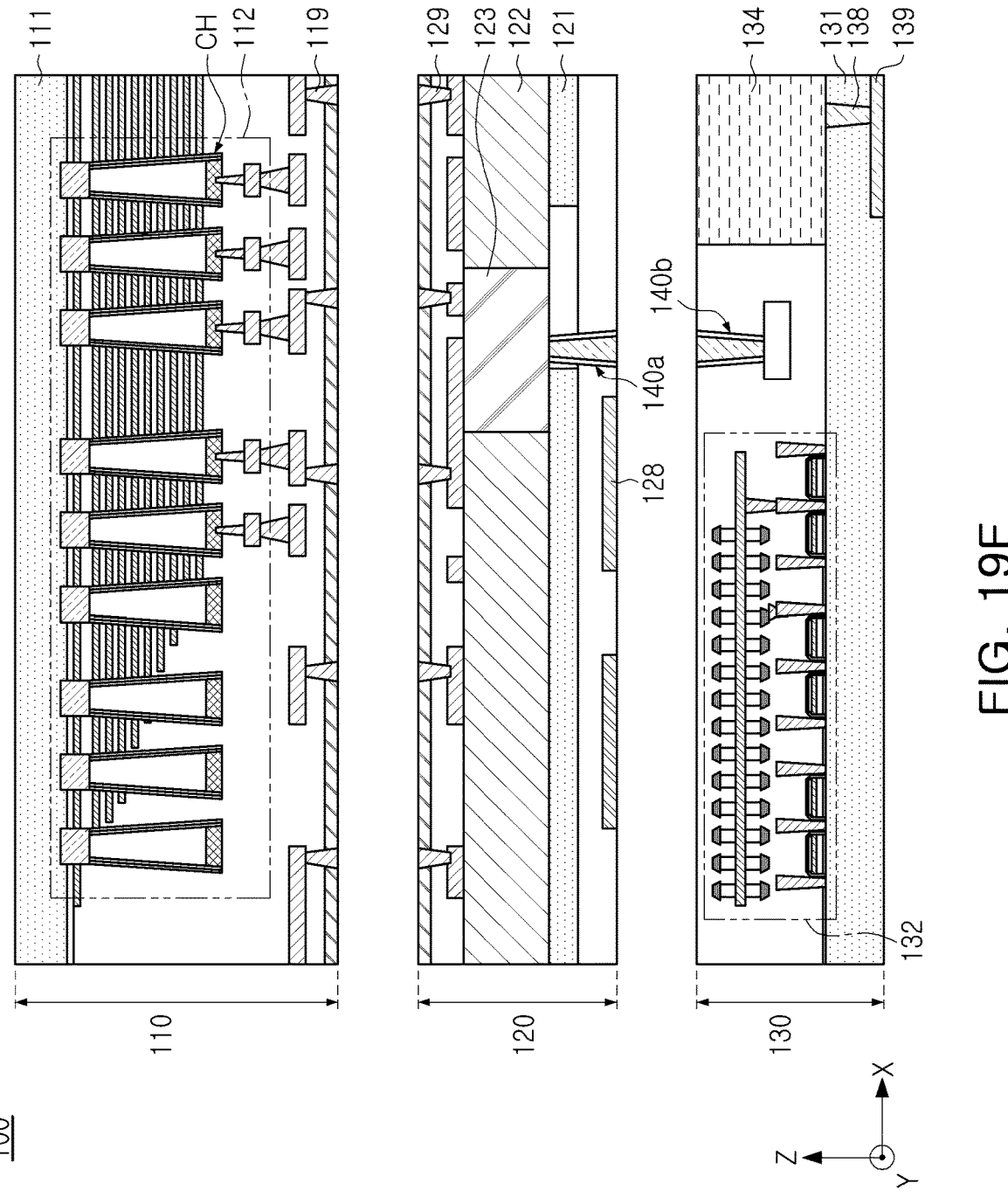

Referring to FIG. 19E, the first semiconductor structure 110, the second semiconductor structure 120, and the third semiconductor structure 130 manufactured through FIGS. 19A to 19D may be bonded to be stacked in the first direction (e.g., Z-direction). For example, the first semiconductor structure 110 may be bonded to the second semiconductor structure 120 through the bonding of the first metal pad 119 and the second metal pad 129. Also, the second semiconductor structure 120 may be bonded to the third semiconductor structure 130 through the bonding of the connection structures 140a and 140b.

According to an example embodiment of the present disclosure, a nonvolatile memory device is implemented in a structure in which a first semiconductor structure including a memory cell area, a second semiconductor structure including a page buffer, and a third semiconductor structure including a buffer memory and peripheral circuits are stacked, so it is possible to secure a space required for an arrangement of the page buffer.

According to an example embodiment of the present disclosure, a nonvolatile memory device may use a space as much as possible by implementing a page buffer using vertical transistors.

According to an example embodiment of the present disclosure, a nonvolatile memory device may use a space as much as possible by implementing a buffer memory and/or peripheral circuits using vertical transistors.

Various and beneficial advantages and effects of the present disclosure are not limited to the contents described above, and may be more easily understood in a process of describing exemplary example embodiments of the present disclosure.

While the present disclosure has been shown and described in connection with the example embodiments, it will be apparent to those in the art that modifications and variations can be made without departing from the spirit and scope of the disclosure as defined by the appended claims. Accordingly, various types of substitutions, modifications and changes will be possible by those of ordinary skill in the art without departing from the present inventive concept described in the claims, and belong to the scope of the present inventive concept.

What is claimed is:

1. A nonvolatile memory device, comprising:
a first semiconductor structure including a first semiconductor substrate, a memory cell area including a plurality of memory cells disposed on the first semiconductor substrate, and a first metal pad disposed on the memory cell area, the plurality of memory cells including gate electrodes stacked apart from each other and channel structures which penetrate through the gate electrodes and are connected to the first semiconductor substrate;
a second semiconductor structure including a second semiconductor substrate, a row decoder on the second semiconductor substrate, a page buffer disposed immediately adjacent to at least one side of the row decoder, and a second metal pad bonded to the first metal pad; and
a third semiconductor structure including a third semiconductor substrate, a buffer memory and peripheral circuits disposed on the third semiconductor substrate, and a third metal pad connected to the peripheral circuits by a first connection structure which penetrates through the third semiconductor substrate,
wherein the second semiconductor structure is connected to the third semiconductor structure by a second connection structure which penetrates through the second semiconductor substrate, and the page buffer includes a plurality of vertical transistors, and
wherein each vertical transistor of the plurality of vertical transistors includes a source area, a channel area, and a drain area sequentially stacked in a first direction, and
wherein the first semiconductor structure, the second semiconductor structure, and the third semiconductor structure are connected in the first direction, and
wherein the first direction comprises a vertical direction, wherein the row decoder is disposed in a center of the second semiconductor structure in a first horizontal direction, and wherein the row decoder extends along an entirety of the second semiconductor structure in a second horizontal direction perpendicular to the first horizontal direction.

2. The nonvolatile memory device of claim 1, wherein the page buffer is disposed on both sides of the row decoder.

3. The nonvolatile memory device of claim 2, wherein the row decoder includes at least a portion of the plurality of vertical transistors.

4. The nonvolatile memory device of claim 1, wherein the page buffer includes a sensing page buffer directly connected to the plurality of memory cells, and at least one general page buffer connected in series with the sensing page buffer.

5. The nonvolatile memory device of claim 4, wherein the sensing page buffer and the at least one general page buffer corresponding to each a memory cell of the plurality of memory cells, and
wherein the sensing page buffer is disposed beside the at least one general page buffer in the first direction.

6. The nonvolatile memory device of claim 5, wherein a general page buffer which is farthest from the sensing page buffer from among the at least one general page buffer is connected to a bit line.

7. The nonvolatile memory device of claim 5, wherein a general page buffer which is farthest from the sensing page buffer from among the at least one general page buffer is connected to a control line for controlling data transmission, and
wherein the buffer memory included in the third semiconductor structure is connected between the control line and a bit line.

8. The nonvolatile memory device of claim 7, wherein the buffer memory includes at least a portion of the plurality of vertical transistors.

9. The nonvolatile memory device of claim 1, wherein data received from outside of the nonvolatile memory device is stored in the buffer memory and then programmed into at least one memory cell of the plurality of memory cells by the page buffer, and
wherein the nonvolatile memory device is configured to determine whether to pass the data through the buffer memory according to characteristics of the data.

10. The nonvolatile memory device of claim 9, wherein based on the buffer memory being full of data, the data is stored in the plurality of memory cells without passing through the buffer memory.

11. The nonvolatile memory device of claim 1, wherein the page buffer includes a sensing page buffer connected between the plurality of memory cells and a bit line.

12. The nonvolatile memory device of claim 11, wherein the third semiconductor structure further includes at least one general page buffer connected to the sensing page buffer.

13. The nonvolatile memory device of claim 1, wherein a contact pad for electrically connecting the page buffer to an external circuit is disposed on a side of the first semiconductor substrate or on a side of the second semiconductor substrate.

14. The nonvolatile memory device of claim 1, wherein the channel area includes a nanowire, and
wherein the each vertical transistor of the plurality of vertical transistors include a gate electrode surrounding the channel area.

15. A nonvolatile memory device, comprising:
a first semiconductor structure including a first semiconductor substrate, a memory cell area including a plurality of memory cells disposed on the first semiconductor substrate, and a first metal pad disposed on the memory cell area, the plurality of memory cells including gate electrodes stacked apart from each other and channel structures which penetrate through the gate electrodes and are connected to the first semiconductor substrate;
a second semiconductor structure including a second semiconductor substrate, a row decoder on the second semiconductor substrate, a page buffer disposed immediately adjacent to at least one side of the row decoder, and a second metal pad bonded to the first metal pad; and
a third semiconductor structure including a third semiconductor substrate, a buffer memory, and other peripheral circuits disposed on the third semiconductor sub-
strate, and a third metal pad connected to the other
peripheral circuits by a connection structure which
penetrates through the third semiconductor substrate, wherein the row decoder is disposed in a center of the
second semiconductor substrate in a first horizontal
direction, and is surrounded by the page buffer, wherein the plurality of memory cells are connected in
order of the page buffer, the row decoder, and the other
peripheral circuits, and wherein the row decoder extends along an entirety of the
second semiconductor structure in a second horizontal
direction perpendicular to the first horizontal direction.

* * * * *